(12) United States Patent
Lee et al.

(10) Patent No.: US 11,791,374 B2
(45) Date of Patent: Oct. 17, 2023

(54) CAPACITOR AND METHOD FOR FABRICATING THE SAME

(71) Applicant: SK hynix Inc., Gyeonggi-do (KR)

(72) Inventors: Myung-Soo Lee, Seoul (KR); Cheol-Hwan Park, Gyeonggi-do (KR); Chee-Hong An, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 102 days.

(21) Appl. No.: 17/567,625

(22) Filed: Jan. 3, 2022

(65) Prior Publication Data
US 2022/0130947 A1   Apr. 28, 2022

Related U.S. Application Data

(63) Continuation of application No. 16/824,759, filed on Mar. 20, 2020, now Pat. No. 11,251,260.

(30) Foreign Application Priority Data

Aug. 30, 2019   (KR) .......................... 10-2019-0107440

(51) Int. Cl.
*H10B 12/00* (2023.01)
*H01L 49/02* (2006.01)

(52) U.S. Cl.
CPC ............ *H01L 28/57* (2013.01); *H10B 12/033* (2023.02); *H10B 12/315* (2023.02); *H10B 12/34* (2023.02)

(58) Field of Classification Search
None
See application file for complete search history.

(56) References Cited

U.S. PATENT DOCUMENTS

2015/0228710 A1* 8/2015 Rui .................. H10B 12/03
438/396

* cited by examiner

*Primary Examiner* — Steven M Christopher
(74) *Attorney, Agent, or Firm* — IP & T GROUP LLP

(57) ABSTRACT

Disclosed is a capacitor having a high dielectric constant and low leakage current and a method for fabricating the same, wherein the capacitor may include a first conductive layer, a second conductive layer, a dielectric layer stack between the first conductive layer and the second conductive layer, a dielectric interface layer between the dielectric layer stack and the second conductive layer, and a high work function interface layer between the dielectric interface layer and the second conductive layer.

10 Claims, 18 Drawing Sheets

CAPACITOR AND METHOD FOR FABRICATING THE SAME

CROSS-REFERENCE TO RELATED APPLICATIONS

This application is a continuation of U.S. patent application Ser. No. 16/824,759 filed on Mar. 20, 2020, which claims benefits of priority of Korean Patent Application No. 10-2019-0107440 filed on Aug. 30, 2019. The disclosure of each of the foregoing application is incorporated herein by reference in its entirety.

BACKGROUND

1. Field

Various embodiments relate to a semiconductor device, and more particularly, to a capacitor and a method for fabricating the same.

2. Description of the Related Art

Improvements in the design and manufacturing of highly-integrated semiconductor memories have accelerated in recent years, resulting in reduced unit cell area and operating voltage. This in turn, requires developing an improved capacitor having higher capacitance and lower leakage current.

SUMMARY

Various embodiments of the present invention are directed to an improved capacitor for a semiconductor device having a high dielectric constant and low leakage current, and a method for fabricating the same.

Various embodiments of the present invention are directed to an improved memory cell including a capacitor having a high dielectric constant and low leakage current.

In accordance with an embodiment, a capacitor may include: a first conductive layer; a second conductive layer; a dielectric layer stack between the first conductive layer and the second conductive layer; a dielectric interface layer between the dielectric layer stack and the second conductive layer; and a high work function interface layer between the dielectric interface layer and the second conductive layer.

In accordance with an embodiment, a capacitor may include: a first conductive layer; a second conductive layer; a multi-layered stack between the first conductive layer and the second conductive layer, wherein the multi-layered stack may include: a first tetragonal zirconium oxide layer over the first conductive layer; a second tetragonal zirconium oxide layer over the aluminum-doped zirconium oxide layer; an aluminum-doped tetragonal zirconium oxide layer between the first tetragonal zirconium oxide layer and the second tetragonal zirconium oxide layer; an aluminum oxide layer over the second tetragonal zirconium oxide layer; a titanium oxide layer over the aluminum oxide layer and a carbon doped zirconium nitride layer over the titanium oxide layer.

In accordance with an embodiment, a memory cell may include: a buried word line embedded in a substrate; a bit line positioned at a higher level than the buried word line; and a capacitor positioned at a higher level than the bit line, wherein the capacitor includes a bottom electrode; a top electrode; a dielectric layer stack between the bottom electrode and the top electrode; a dielectric interface layer between the dielectric layer stack and the top electrode; and a high work function interface layer between the dielectric interface layer and the top electrode, wherein the dielectric layer stack includes a zirconium oxide-based material, and the high work function interface layer includes a zirconium nitride-based material.

In accordance with an embodiment, a method for fabricating a capacitor may include: forming a first conductive layer; forming a dielectric layer stack in which a leakage blocking material is embedded on the first conductive layer; forming a dielectric interface layer on the dielectric layer stack; forming a high work function interface layer on the dielectric interface layer; and forming a second conductive layer on the high work function interface layer.

DETAILED DESCRIPTION

Figure 1:
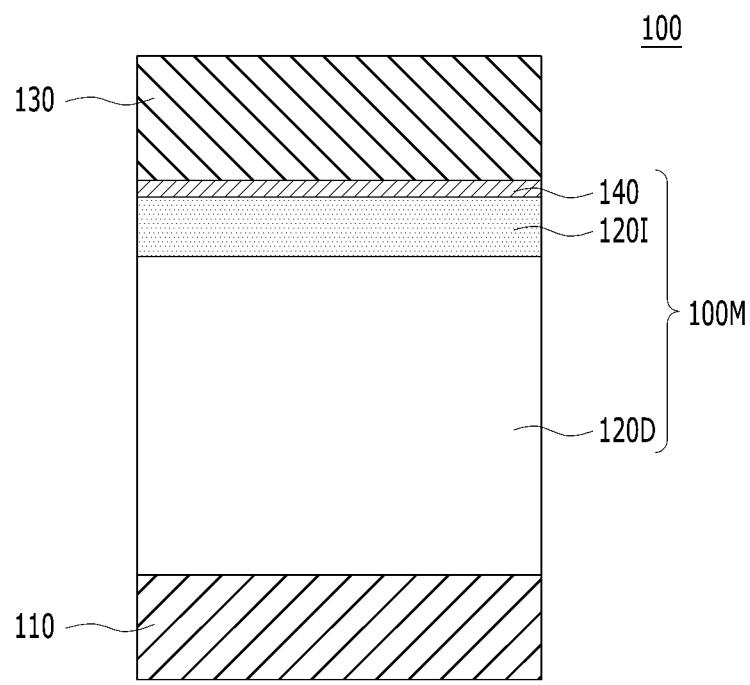
FIG. 1 is a cross-sectional view illustrating a capacitor in accordance with an embodiment of the present disclosure.

Various examples and embodiments described herein will be described with reference to cross-sectional views, plan views and block diagrams, which are ideal schematic views of the present invention. Thus, the shape of the illustrations may be modified by fabricating techniques and/or tolerances. Accordingly, the embodiments of the present invention are not limited to the specific forms shown, but also include changes in the shapes that are generated according to the fabricating process. The regions illustrated in the figures have schematic attributes, and the shapes of the regions illustrated in the figures are intended to illustrate specific types of regions of the elements and are not intended to limit the scope of the invention.

A capacitor may include a bottom electrode, a dielectric layer and a top electrode. As the thickness of the dielectric layer decreases, leakage current may increase. A dielectric constant and an energy bandgap (hereinafter abbreviated as a "bandgap") of the dielectric layer are inversely proportional to each other. In order to suppress the leakage current, the thickness of the dielectric layer may be increased or a dielectric layer having a low dielectric constant may be used. An increase in the thickness of the dielectric layer and the low dielectric constant of the dielectric layer may increase the electrical thickness of the dielectric layer, that is, an equivalent oxide thickness (EOT). When the thickness of the dielectric layer is reduced to decrease the EOT, the reduced thickness of the dielectric layer becomes less than the minimum thickness necessary for crystallization of the dielectric layer, thereby increasing amorphous characteristics. Therefore, although the thickness of the dielectric layer is reduced, there is limitation in an increase of capacitance.

In addition, the top electrode of the capacitor may be formed in a strong reducing atmosphere. For example, the strong reducing atmosphere may include gases such as $NH_3$, $SiH_x$, $GeH_x$ and $BH_x$. Since the strong reducing atmosphere causes a loss of oxygen in the dielectric layer, the quality of the dielectric layer may be degraded.

A dead layer (DL) having a low dielectric constant may be present at the interface between the dielectric layer and the top electrode. The DL may be formed in a reducing atmosphere when the top electrode is deposited. Further, the DL may be formed due to oxidation of the top electrode. The DL may serve as an obstacle to lowering the EOT.

Hereinafter, embodiments are directed to interfacial engineering that may prevent the reduction of the dielectric layer. In addition, embodiments are directed to interfacial engineering that may increase the dielectric constant of the dielectric layer. Furthermore, embodiments are directed to interfacial engineering that may reduce the leakage current.

In embodiments, which are to be described below, a high work function interface layer may be formed at the interface between a dielectric layer and a conductive layer. The high work function interface layer may serve as a leakage current barrier with a high effective work function (eWF) and a large conduction band offset (CBO). The eWF may be increased to approximately 4.7 eV or higher by the high work function interface layer.

Figure 2A:
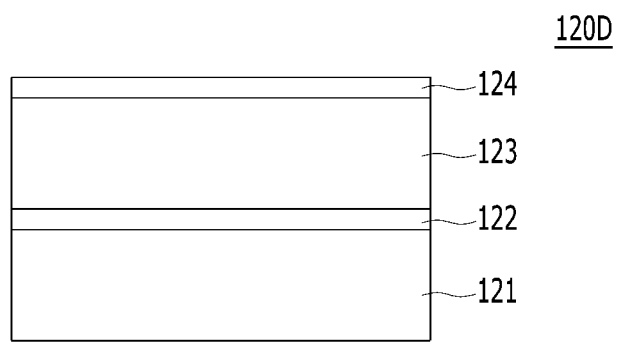
FIG. 2A is a cross-sectional view schematically illustrating an example of a dielectric layer stack employed in the capacitor of FIG. 1.
Figure 2B:
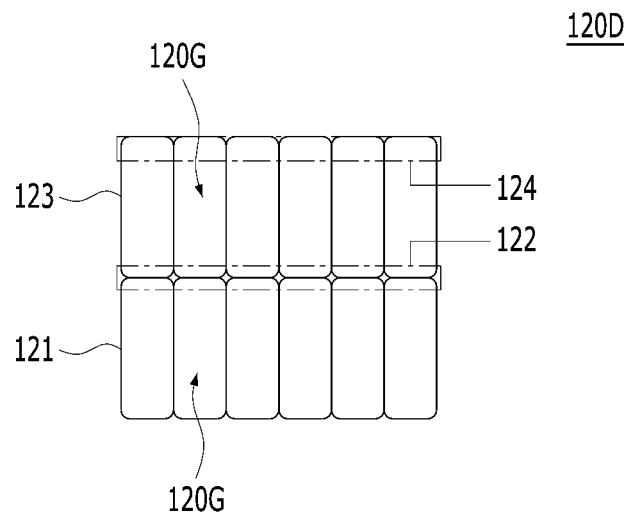
FIG. 2B is a more detailed cross-sectional view illustrating the dielectric layer stack.
Figure 2C:
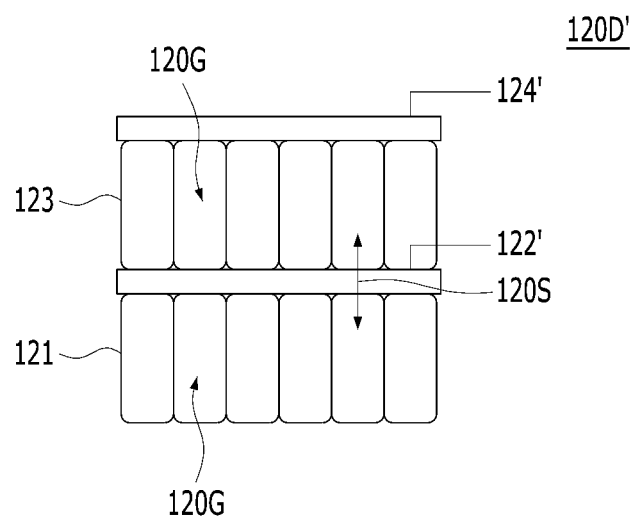
FIG. 2C is a detailed cross-sectional view illustrating a dielectric layer stack according to a comparative example.

FIG. 1 is a cross-sectional view illustrating a capacitor 100 in accordance with an embodiment. FIG. 2A is a cross-sectional view schematically illustrating an example of a dielectric layer stack employed in the capacitor of FIG. 1. FIG. 2B is a more detailed cross-sectional view illustrating the dielectric layer stack. FIG. 2C is a detailed cross-sectional view illustrating a dielectric layer stack according to a comparative example.

Referring to FIG. 1, the capacitor 100 may include a first conductive layer 110, a multi-layered stack 100M and a second conductive layer 130.

The first conductive layer 110 may include a silicon-containing material, a germanium-containing material, a metal, a metal-containing material, or combinations thereof. The first conductive layer 110 may include a metal, metal nitride, metal carbide, conductive metal nitride, conductive metal oxide or combinations thereof. For example, the first conductive layer 110 may include titanium (Ti), titanium nitride (TiN), tantalum nitride (TaN), tungsten (W), tungsten nitride (WN), ruthenium (Ru), iridium (Ir), ruthenium oxide ($RuO_2$), molybdenum, molybdenum oxide, iridium oxide ($IrO_2$) or combinations thereof. In some embodiments, the first conductive layer 110 may include a silicon-containing material. The first conductive layer 110 may include silicon, silicon germanium or a combination thereof. In some embodiments, the first conductive layer 110 may include a stack of a metal-containing material and a silicon-containing material. The first conductive layer 110 may be referred to as a "bottom electrode" or a "storage node".

The second conductive layer 130 may include a silicon-containing material, a germanium-containing material, a metal, a metal-containing material or combinations thereof. The second conductive layer 130 may include a metal, metal nitride, metal carbide, conductive metal nitride, conductive metal oxide or combinations thereof. The second conductive layer 130 may include titanium (Ti), titanium nitride (TiN), tantalum nitride (TaN), titanium carbon nitride (TiCN), tantalum carbon nitride (TaCN), tungsten (W), tungsten nitride (WN), ruthenium (Ru), iridium (Ir), ruthenium oxide ($RuO_2$), molybdenum, molybdenum oxide, iridium oxide ($IrO_2$) or combinations thereof. The second conductive layer 130 may include silicon (Si), germanium (Ge), silicon germanium (SiGe) or combinations thereof. The second conductive layer 130 may include a Si/SiGe stack in which silicon germanium (SiGe) is stacked on silicon (Si). The second conductive layer 130 may include a Ge/SiGe stack in which silicon germanium (SiGe) is stacked on germanium (Ge). The second conductive layer 130 may be formed by stacking silicon germanium (SiGe) on metal nitride. In some embodiments, the second conductive layer 130 may have a structure in which titanium nitride (TiN), silicon germanium (SiGe) and tungsten (W) are sequentially stacked. In some embodiments, the second conductive layer 130 may have a structure in which titanium nitride (TiN), silicon germanium (SiGe) and tungsten nitride (WN) are sequentially stacked. In the present embodiment, the second conductive layer 130 may include a TiN/SiGe stack in which silicon germanium (SiGe) is stacked on titanium nitride (TiN). The second conductive layer 130 may be referred to as a "top electrode" or a "plate node".

The multi-layered stack 100M may include a dielectric layer stack 120D and a dielectric interface layer 120I. The dielectric layer stack 120D may include a multi-layered material, a laminated material, an intermixing material or combinations thereof. The dielectric layer stack 120D may include a high-k material. The high-k material as this term is used herein refers to a material having a higher dielectric constant than both silicon oxide and silicon nitride. The dielectric layer stack 120D may include a combination of a high-k material and an ultra high-k material. The dielectric layer stack 120D may include a stack of at least one layer of a high-k material and at least one layer of an ultra high-k material. The dielectric layer stack 120D may include an intermixing material of a high-k material and an ultra high-k material. The ultra high-k material may have a higher dielectric constant than the high-k material. For example, the high-k material may have a dielectric constant of approximately 10 or higher, and the ultra high-k material may have a dielectric constant of approximately 60 or higher. The dielectric layer stack 120D may include metal oxide-based material. The dielectric layer stack 120D may include aluminum oxide, hafnium oxide, zirconium oxide or combinations thereof. The dielectric layer stack 120D may be formed directly on the first conductive layer 110.

The dielectric interface layer 120I may be a material different from the dielectric layer stack 120D. The dielectric interface layer 120I may serve to protect the dielectric layer stack 120D when the second conductive layer 130 is formed. In addition, the dielectric interface layer 120I may reduce leakage current of the dielectric layer stack 120D.

The dielectric interface layer 120I may be a material that is reduced ahead of the dielectric layer stack 120D when the second conductive layer 130 is deposited. The dielectric interface layer 120I may serve as a leakage current barrier having a high effective work function (eWF) and a large conduction band offset (CBO). In addition, the dielectric interface layer 1201 may not increase the equivalent oxide layer thickness $T_{ox}$ of the dielectric layer stack 120D.

The dielectric interface layer 1201 may be a material having high electronegativity. The dielectric interface layer 1201 may have higher Pauling electronegativity than the dielectric layer stack 120D. The dielectric interface layer 1201 may include a material having higher Pauling electronegativity (hereinafter abbreviated as "electronegativity") than zirconium oxide and hafnium oxide. A material having high electronegativity is difficult to oxidize and easy to reduce. Thus, the dielectric interface layer 1201 may be deprived of oxygen instead of the dielectric layer stack 120D. As a result, the dielectric interface layer 1201 may prevent an oxygen loss of the dielectric layer stack 120D.

The dielectric interface layer 1201 may include an atom having high electronegativity, for example, a metal atom, a silicon atom or a germanium atom. The dielectric interface layer 1201 may include titanium (Ti), tantalum (Ta), aluminum (Al), tin (Sn), molybdenum (Mo), ruthenium (Ru), iridium (Ir), niobium (Nb), germanium (Ge), silicon (Si) or combinations thereof. The dielectric interface layer 1201 may include metal oxide-based material, silicon oxide-based material or germanium oxide-based material.

The dielectric interface layer 1201 may include titanium oxide, tantalum oxide, niobium oxide, aluminum oxide, silicon oxide ($SiO_2$), tin oxide, germanium oxide, molybdenum dioxide, molybdenum trioxide, iridium oxide, ruthenium oxide or combinations thereof. In the present embodiment, the dielectric interface layer 1201 may be formed of titanium oxide, which may be referred to as a "titanium (Ti)-based interface layer".

The multi-layered stack 100M may further include a high work function interface layer 140. The high work function interface layer 140 may be formed on the dielectric interface layer 1201. The high work function interface layer 140 may be formed directly on the dielectric interface layer 1201. The high work function interface layer 140 may be positioned between the dielectric interface layer 1201 and the second conductive layer 130. The high work function interface layer 140 may suppress the reduction of the dielectric layer stack 120D when the second conductive layer 130 is deposited, and increase an effective work function between the dielectric layer stack 120D and the second conductive layer 130.

The dielectric interface layer 1201 and the high work function interface layer 140 may be made of different materials. The high work function interface layer 140 may be made of a material deposited by atomic layer deposition (ALD). The high work function interface layer 140 may include a high work function material. The high work function interface layer 140 may include a material that further increases an effective work function than when the dielectric interface layer 1201 is used. As a result, the present embodiments may further improve leakage current through a combination of the dielectric interface layer 1201 and the high work function interface layer 140.

The high work function interface layer 140 may include a zirconium-based material. The high work function interface layer 140 may include zirconium nitride (ZrN) or carbon-containing zirconium nitride. The carbon-containing zirconium nitride may include ZrCN. In the carbon-containing zirconium nitride, the effective work function may be adjusted according to the content of carbon. The content of carbon may be adjusted by controlling a flow rate of a zirconium source material and a flow rate of a reaction gas. As the zirconium source material, a carbon-containing zirconium source may be used.

The zirconium nitride (ZrN) and the carbon-containing zirconium nitride as the high work function interface layer 140 may be formed by ALD. For example, the zirconium nitride (ZrN) and the carbon-containing zirconium nitride may be formed using a zirconium (Zr) source material and a reaction gas. The reaction gas may include $NH_3$. For example, the zirconium source material may include cyclopentadienyl tris-dimethylamino zirconium $CpZr(NME_2)_3$ (ZAC). The ZAC may be a carbon-containing zirconium source material, and carbon-doped zirconium nitride may be deposited using the ZAC. The carbon content of the carbon-doped zirconium nitride may be adjusted by a flow rate of the carbon-containing zirconium source material. The ALD for forming the zirconium nitride and the carbon-doped zirconium nitride may repeat a unit cycle of a zirconium source material injection, a purge, a reaction gas injection, and a purge for several times.

In the present embodiment, the dielectric interface layer 1201 may be a titanium-based interface layer, and the high work function interface layer 140 may be a zirconium-based interface layer. The high work function interface layer 140 may have smaller thickness than the dielectric interface layer 1201. The dielectric layer stack 120D may be a zirconium oxide-based material. Each of the dielectric layer stack 120D and the high work function interface layer 140 may include a zirconium-based material. The dielectric layer stack 120D may include a zirconium oxide-based material, and the high work function interface layer 140 may include a zirconium nitride-based material.

FIG. 2A is a schematic diagram of an example of the dielectric layer stack 120D. The dielectric layer stack 120D may include a first dielectric layer 121 and a second dielectric layer 123. The first and second dielectric layers 121 and 123 may have a high dielectric constant of approximately 40 or higher. Each of the first and second dielectric layers 121 and 123 may have a tetragonal crystal structure. The first and second dielectric layers 121 and 123 may be made of the same material. Each of the first and second dielectric layers 121 and 123 may include a zirconium oxide-based material. Each of the first and second dielectric layers 121 and 123 may include zirconium oxide. Each of the first and second dielectric layers 121 and 123 may include tetragonal zirconium oxide. The first and second dielectric layers 121 and 123 may be formed by ALD.

The dielectric layer stack 120D may further include a first leakage blocking layer 122 and a second leakage blocking layer 124. The first and second leakage blocking layers 122 and 124 may serve to suppress leakage current of the dielectric layer stack 120D. Each of the first and second leakage blocking layers 122 and 124 may include a high bandgap material. The first and second leakage blocking layers 122 and 124 may include materials having higher bandgap energy than the first and second dielectric layers 121 and 123. The first and second leakage blocking layers 122 and 124 may be made of different materials from the first and second dielectric layers 121 and 123. Each of the first and second leakage blocking layers 122 and 124 may include a high-k material, but have a lower dielectric constant than the first and second dielectric layers 121 and 123. In an embodiment, each of the first and second leakage blocking layers 122 and 124 may have a higher dielectric constant than silicon oxide ($SiO_2$). It is noted that that silicon oxide has a dielectric constant of about 3.9. For example, each of the first and second leakage blocking layers 122 and 124 may be made of aluminum oxide or beryllium oxide. The beryllium oxide may be amorphous. The beryllium oxide may have a wurtzite crystal structure or a rocksalt structure. The first and second leakage blocking layers 122 and 124 may be formed by ALD. The first and second leakage blocking layers 122 and 124 may have smaller thicknesses than the first and second dielectric layers 121 and 123, and thus a decrease in capacitance of the dielectric layer stack 120D may be minimized.

In another embodiment, each of the first and second leakage blocking layers 122 and 124 may have a higher dielectric constant than silicon nitride ($Si_3N_4$). It is noted that silicon nitride has a dielectric constant of about 7.5.

In some embodiments, the first leakage blocking layer 122 may be extremely thin and may be embedded in the first dielectric layer 121 or/and the second dielectric layers 123. The first leakage blocking layer 122 may not separate the crystal grains of the first and second dielectric layers 121 and 123. In other words, the first leakage blocking layer 122 may not separate the tetragonal crystal structures of the first and second dielectric layers 121 and 123. The first leakage blocking layer 122 may be made by placing a dopant inside a top surface of the first dielectric layer 121 or a bottom surface of the second dielectric layers 123 to form an extremely thin doped interface.

For example, when the first and second dielectric layers 121 and 123 include the tetragonal zirconium oxide, the first leakage blocking layer 122 may include tetragonal zirconium oxide doped with a dopant. The dopant of the first leakage blocking layer 122 may include aluminum (Al) or beryllium (Be). For example, the first leakage blocking layer 122 may include aluminum-doped tetragonal zirconium oxide or beryllium-doped zirconium oxide.

The thicknesses of the first and second dielectric layers 121 and 123 may be adjusted because of the first leakage blocking layer 122. The first leakage blocking layer 122 may have a higher bandgap than the first and second dielectric layers 121 and 123. Each of the first and second dielectric layers 121 and 123 may have a bandgap energy of approximately 5.8 eV, and the first leakage blocking layer 122 may have a bandgap energy of approximately 8.8 eV to approximately 10.6 eV.

The second leakage blocking layer 124 may be formed between the second dielectric layer 123 and the dielectric interface layer 1201. The second leakage blocking layer 124 may be embedded on the uppermost surface of the second dielectric layer 123. The second leakage blocking layer 124 may be formed of the same material as the first leakage blocking layer 122. For example, the second leakage blocking layer 124 may include aluminum-doped zirconium oxide or beryllium-doped zirconium oxide. Because of the increased band gap energy provided by the first and second leakage blocking layers 122 and 124, the thickness of the overall dielectric layer stack may be reduced to improve the capacitance of the capacitor 100 while also improving the leakage blocking property of the capacitor 100. In some embodiments, the first leakage blocking layer 122 may include aluminum-doped tetragonal zirconium oxide, and the second leakage blocking layer 124 may include aluminum oxide. In some embodiments, the first leakage blocking layer 122 and the second leakage blocking layer 124 are thinner than the first dielectric layer 121 and the second dielectric layer 123. In some embodiments, the first leakage blocking layer 122 and the second leakage blocking layer 124 are thinner than the first dielectric layer 121 and the second dielectric layer 123.

As described above, the high bandgaps of the first and second leakage blocking layers 122 and 124 may suppress the leakage current of the capacitor 100.

FIG. 2B is a more detailed diagram illustrating the dielectric layer stack 120D.

Referring to FIG. 2B, the dielectric layer stack 120D in which the first and second leakage blocking layers 122 and 124 are embedded may be divided into the first dielectric layer 121, the first leakage blocking layer 122, the second dielectric layer 123 and the second leakage blocking layer 124. The first dielectric layer 121, the first leakage blocking layer 122, the second dielectric layer 123 and the second leakage blocking layer 124 may have crystal grains 120G which are not separated but continuous to one another. Each of the first dielectric layer 121, the first leakage blocking layer 122, the second dielectric layer 123 and the second leakage blocking layer 124 may have a tetragonal crystal structure. The first leakage blocking layer 122 may not separate the crystal grains 120G of the first dielectric layer 121 from the crystal grains 120G of the second dielectric layer 123. The first and second leakage blocking layers 122 and 124 may have an extremely smaller thickness than the first and second dielectric layers 121 and 123.

Each of the first and second dielectric layers 121 and 123 may be undoped tetragonal zirconium oxide undoped with a dopant, and each of the first and second leakage blocking layers 122 and 124 may be doped tetragonal zirconium oxide doped with a dopant. The first and second leakage blocking layers 122 and 124 may include aluminum or beryllium as the dopant.

As described above, although each of the first and second leakage blocking layers 122 and 124 includes a dopant, each of the first and second leakage blocking layers 122 and 124 may not be an oxide layer of the dopant. For example, the first and second leakage blocking layers 122 and 124 may not be aluminum oxide ($Al_2O_3$) layers but aluminum-doped tetragonal zirconium oxide.

In the present embodiment, the first dielectric layer 121, the first leakage blocking layer 122, the second dielectric layer 123 and the second leakage blocking layer 124 may be a first zirconium oxide layer, a first aluminum-doped zirconium oxide layer, a second zirconium oxide layer and a second aluminum-doped zirconium oxide layer, respectively. Accordingly, the dielectric layer stack 120D may include a "Z-AZ-Z-AZ stack" in which the first zirconium oxide layer, the first aluminum-doped zirconium oxide layer, the second zirconium oxide layer and the second aluminum-doped zirconium oxide layer are sequentially stacked. In the Z-AZ-Z-AZ stack, "Z" may refer to zirconium oxide, and "AZ" may refer to aluminum-doped zirconium oxide. All materials of the Z-AZ-Z-AZ stack may have tetragonal crystal structures.

FIG. 2C is a diagram illustrating a dielectric layer stack 120D' according to a comparative example.

Referring to FIG. 2C, the dielectric layer stack 120D' may include a first dielectric layer 121, an aluminum oxide ($Al_2O_3$) layer 122', a second dielectric layer 123 and an aluminum oxide ($Al_2O_3$) layer 124'. Crystal grains 120G of the first dielectric layer 121 and crystal grains 120G of the second dielectric layer 123 may be separated from each other by the aluminum oxide layer 122' (refer to reference numeral "120S"). The crystal grains of the first and second dielectric layers 121 and 123 may be vertically separated by the aluminum oxide layer 122'. The aluminum oxide layer 122' may have a larger thickness than the first leakage blocking layer 122 of FIG. 2B, and may be a continuous layer. When the first and second dielectric layers 121 and 123 include zirconium oxide, the dielectric layer stack 120D' may be referred to as a "Z-A-Z-A stack". In the Z-A-Z-A stack, "Z" may refer to zirconium oxide, and "A" may refer to aluminum oxide.

The dielectric layer stack 120D according to the present embodiment includes the Z-AZ-Z-AZ stack, whereas the dielectric layer stack 120D' according to the comparative example includes the Z-A-Z-A stack. In the Z-AZ-Z-AZ stack, the crystal grains of the first zirconium oxide layer are not separated from the crystal grains of the second zirconium oxide layer by the aluminum-doped zirconium oxide layer. On the contrary, in the Z-A-Z-A stack, the crystal grains of the first zirconium oxide layer are separated from the crystal grains of the second zirconium oxide layer by the aluminum oxide layer.

In the comparative example, when the crystal grains 120G of the first dielectric layer 121 are separated from the crystal grains 120G of the second dielectric layer 123 by the aluminum oxide layer 122', dielectric constants of the first and second dielectric layers 121 and 123 decrease. When the dielectric constants of the first and second dielectric layers 121 and 123 decrease, it is not possible to decrease the equivalent oxide layer thickness $T_{ox}$.

According to FIG. 2B described above, it is possible to decrease the equivalent oxide layer thickness while increasing the dielectric constant of the dielectric layer stack 120D in which the first and second leakage blocking layers 122 and 124 are embedded. The leakage current of the dielectric layer stack 120D may be suppressed by the first and second leakage blocking layers 122 and 124.

In some embodiments, the second leakage blocking layer 124 may be omitted. Accordingly, the dielectric layer stack 120D may include the first and second dielectric layers 121 and 123 in which the first leakage blocking layer 122 is embedded. The dielectric layer stack 120D may include a Z-AZ-Z stack. All materials of the Z-AZ-Z stack may have tetragonal crystal structures.

FIGS. 3A to 3D are cross-sectional views illustrating a method for fabricating a capacitor in accordance with an embodiment of the present disclosure.

Figure 3A:
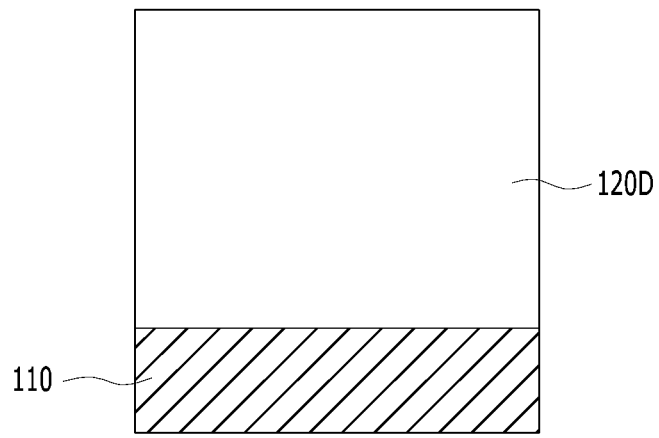
FIGS. 3A to 3D are cross-sectional views illustrating a method for fabricating a capacitor in accordance with an embodiment of the present disclosure.

As illustrated in FIG. 3A, a first conductive layer 110 may be formed. The first conductive layer 110 may include a metal or a metal-containing material. The first conductive layer 110 may include a metal, metal nitride, metal carbide, conductive metal nitride, conductive metal oxide or combinations thereof. The first conductive layer 110 may include titanium (Ti), titanium nitride (TIN), tantalum nitride (TaN), tungsten (W), tungsten nitride (WN), ruthenium (Ru), iridium (Ir), ruthenium oxide ($RuO_2$), molybdenum, molybdenum oxide, iridium oxide ($IrO_2$) or combinations thereof. In the present embodiment, the first conductive layer 110 may be referred to as a "bottom electrode" or a "storage node". The first conductive layer 110 may be formed with ALD titanium nitride, i.e., titanium nitride deposited by ALD.

A dielectric layer stack 120D may be formed on the first conductive layer 110. The dielectric layer stack 120D may be formed directly on the first conductive layer 110. The dielectric layer stack 120D may be the same as the dielectric layer stack 120D illustrated in FIGS. 2A and 2B.

The dielectric layer stack 120D may be deposited by ALD. For example, a substrate prepared with the first conductive layer 110 may be loaded into an atomic layer deposition chamber, and then the dielectric layer stack 120D may be deposited on the first conductive layer 110.

When the dielectric layer stack 120D is a zirconium oxide-based material, atomic layer deposition of zirconium oxide may be performed. For example, the atomic layer deposition of the zirconium oxide may repeat a unit cycle consisting of a zirconium source material injection, a purge, a reaction gas material injection, and a purge for several times.

The dielectric layer stack 120D may be further subjected to an aluminum source material injection and a purge while the zirconium oxide is deposited. The atomic layer deposition of the dielectric layer stack 120D may be performed in the order of deposition of first zirconium oxide, formation of a first leakage blocking layer, deposition of second zirconium oxide and formation of a second leakage blocking layer. The first and second zirconium oxide may be deposited using the same unit cycle. The first and second leakage blocking layer may be formed using the same unit cycle.

The first and second zirconium oxide may be deposited by repeating the unit cycle consisting of a zirconium source material injection, a purge, a reaction gas material injection and a purge for several times. The first and second leakage blocking layers may be formed by repeating a unit cycle consisting of an aluminum source material injection and a purge for several times. Accordingly, the dielectric layer stack 120D in which a first leakage blocking layer 122 and a second leakage blocking layer 124 are embedded may be deposited. The dielectric layer stack 120D may be a material in which aluminum is embedded in the zirconium oxide.

Figure 3B:
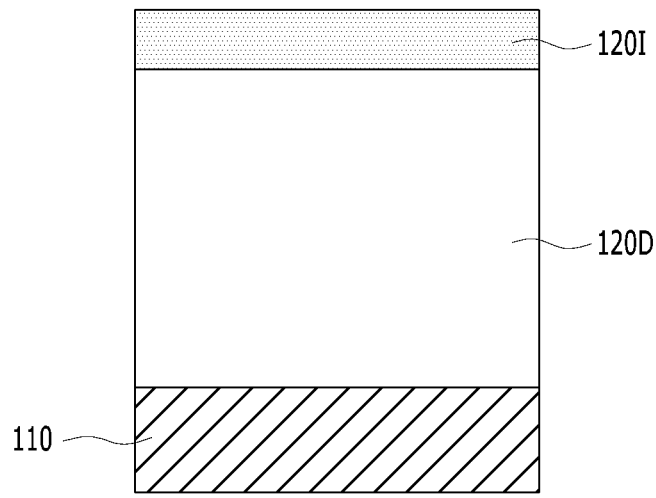

As illustrated in FIG. 3B, a dielectric interface layer 1201 may be formed on the dielectric layer stack 120D. The dielectric interface layer 1201 may be formed directly on the dielectric layer stack 120D. The dielectric interface layer 1201 may be deposited by ALD. The dielectric interface layer 1201 may include a titanium oxide-based material. The dielectric interface layer 1201 may be formed by ALD of titanium oxide. The ALD of the titanium oxide may be performed by repeating a unit cycle consisting of a titanium source material injection, a purge, a reaction gas injection and a purge for several times. As the titanium source material, $TiCl_4$ may be used, and as the reaction gas, oxygen-containing gas may be used.

Figure 3C:
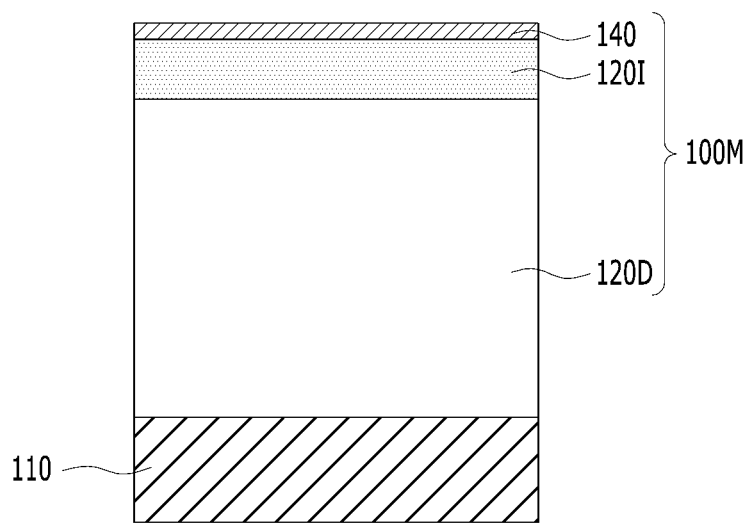

As illustrated in FIG. 3C, a high work function interface layer 140 may be formed on the dielectric interface layer 1201. The high work function interface layer 140 may be formed directly on the dielectric interface layer 1201. The high work function interface layer 140 may be deposited by ALD. The high work function interface layer 140 may include a zirconium-based material. The high work function interface layer 140 may be formed by ALD of zirconium nitride. The ALD of the zirconium nitride may be performed by repeating a unit cycle consisting of a zirconium source material injection, a purge, a reaction gas injection and a purge for several times. As the zirconium source material, $ZAC(CpZr(NME_2)_3)$ may be used, and as the reaction gas, a nitrogen-containing gas may be used. The nitrogen-containing gas may include $NH_3$. A flow rate of the nitrogen-containing gas or a flow rate of the ZAC may be adjusted to deposit carbon-doped zirconium nitride. The carbon content of the carbon-doped zirconium nitride may be adjusted by the flow rate of ZAC, not the flow rate of nitrogen-containing gas. The flow rate and cycle number of the nitrogen-containing gas may contribute to improving leakage current. For example, when the flow rate of the nitrogen-containing gas increases or the cycle number of the nitrogen-containing gas decreases, the leakage current of the capacitor may be improved. The multi-layered stack 100M may include the dielectric layer stack 120D, the dielectric interface layer 1201, and the high work function interface layer 140.

Figure 3D:
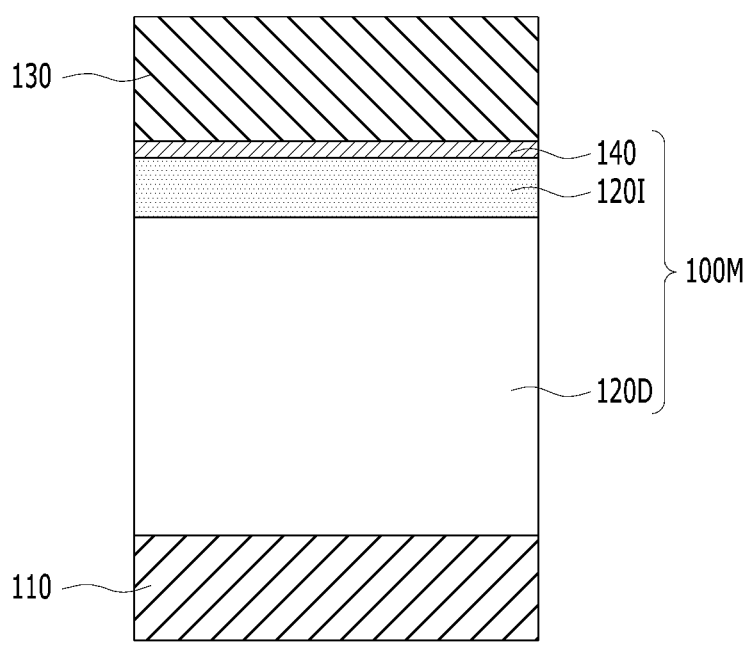

As illustrated in FIG. 3D, a second conductive layer 130 may be formed on the high work function interface layer 140. The second conductive layer 130 may be formed directly on the high work function interface layer 140. The second conductive layer 130 may include a metal-containing material. The second conductive layer 130 may include a metal, metal nitride, metal carbide, conductive metal nitride, conductive metal oxide or combinations thereof. The second conductive layer 130 may include titanium (Ti), titanium nitride (TiN), tantalum nitride (TaN), tungsten (W), tungsten nitride (WN), ruthenium (Ru), iridium (Ir), ruthenium oxide ($RuO_2$), molybdenum, molybdenum oxide, iridium oxide ($IrO_2$) or combinations thereof. The second conductive layer 130 may have a structure in which titanium nitride (TiN) and silicon germanium (SiGe) are sequentially stacked. The high work function interface layer 140 may prevent the dielectric interface layer 1201 and the dielectric layer stack 120D from being reduced when the second conductive layer 130 is formed. Accordingly, oxygen loss of the dielectric layer stack 120D may be prevented.

In the above-described embodiments, the dielectric layer stack 120D, the dielectric interface layer 1201 and the high work function interface layer 140 may be sequentially stacked between the first conductive layer 110 and the second conductive layer 130. Since the dielectric layer stack 120D includes a zirconium oxide stack, i.e., a Z-AZ-Z-AZ stack, in which aluminum is embedded, and the dielectric interface layer 1201 and the high work function interface layer 140 include titanium oxide and zirconium nitride, respectively, a "Z-AZ-Z-AZ-T-ZN stack" may be formed between the first conductive layer 110 and the second conductive layer 130. In the Z-AZ-Z-AZ-T-ZN stack, "ZN" may refer to zirconium nitride.

Figure 4:
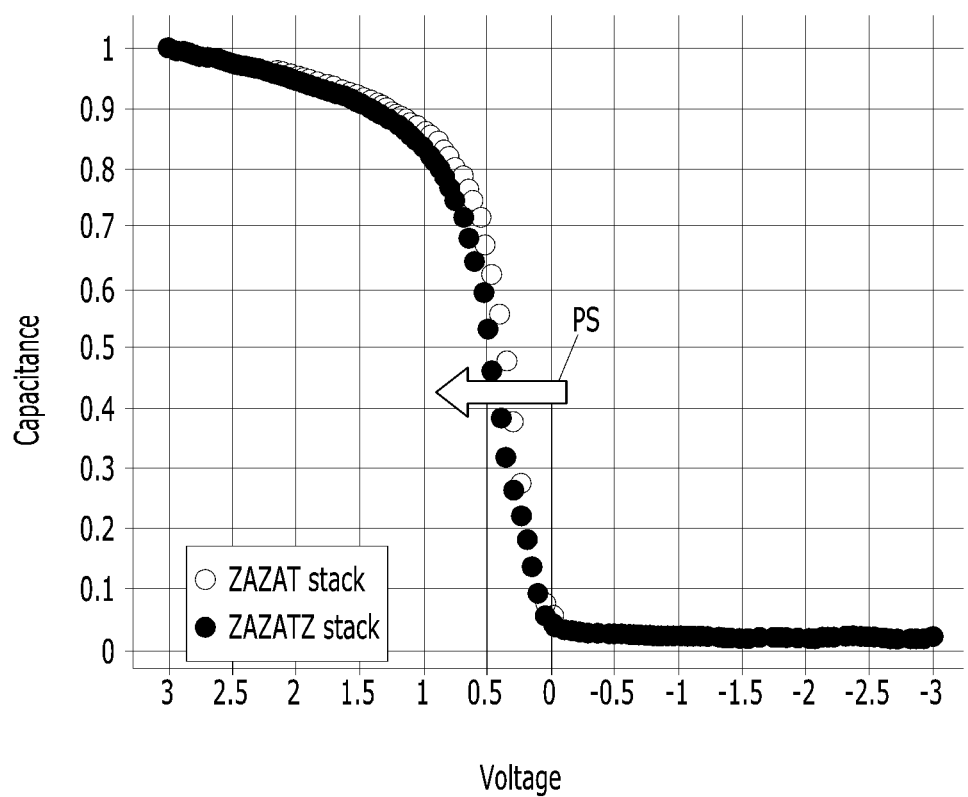
FIG. 4 is a diagram describing a change in a work function according to formation of a high work function interface layer.

FIG. 4 is a diagram describing a change in a work function according to formation of the high work function interface layer 140. FIG. 4 compares capacitance/voltage (C-V) characteristics and illustrates a shift of a flat band voltage. The flat band voltage may depend on a work function. The flat band voltage may be shifted by increasing or decreasing the work function. A high work function may shift the flat band voltage in a positive direction, and a low work function may shift the flat band voltage in a negative direction.

In FIG. 4, a ZAZAT stack may refer to a Z-AZ-Z-AZ-T stack in which the high work function interface layer 140 is omitted, and the dielectric layer stack 120D and the dielectric interface layer 1201 are stacked. A ZAZATZ stack may refer to the Z-AZ-Z-AZ-T-ZN stack in which the dielectric layer stack 120D, the dielectric interface layer 1201 and the high work function interface layer 140 are stacked.

Referring to FIG. 4, it may be seen that the flat band voltage is shifted in the positive direction in the ZAZATZ stack (refer to reference numeral "PS"), and thus an effective work function is further increased in the ZAZATZ stack than in the ZAZAT stack. The effective work function may be further increased by 0.1 eV to 0.2 eV in the ZAZATZ stack than in the ZAZAT stack. For example, the effective work function of approximately 4.6 eV may be obtained by the ZAZAT stack, and the effective work function of approximately 4.8 eV or higher may be obtained by the ZAZATZ stack.

Figure 5:
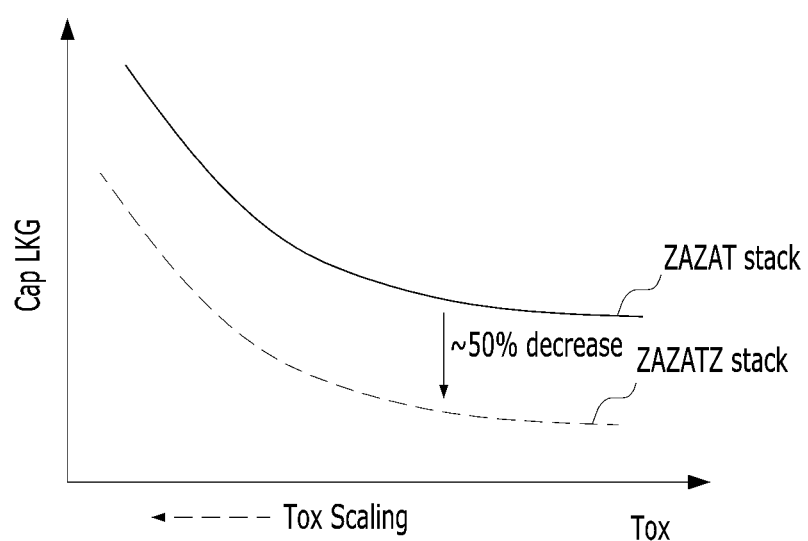
FIG. 5 is a diagram describing leakage current according to formation of a high work function interface layer.

FIG. 5 is a diagram describing leakage current Cap LKG according to formation of the high work function interface layer 140. Referring to FIG. 5, it may be seen that the leakage current Cap LKG is further decreased in the ZAZATZ stack than in the ZAZAT stack. For example, the leakage current Cap LKG may be further decreased by approximately 50% in the ZAZATZ stack than in the ZAZAT stack. In addition, the equivalent oxide thickness $T_{ox}$ may be further decreased in the ZAZATZ stack than in the ZAZAT stack (refer to reference symbol "$T_{ox}$ Scaling").

Figure 6A:
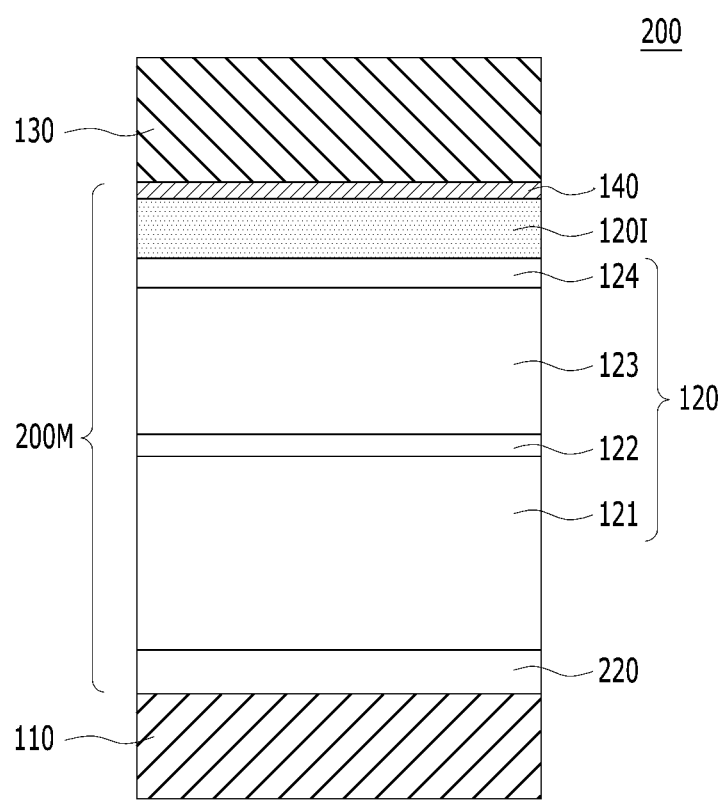
FIGS. 6A and 6B are cross-sectional views illustrating capacitors in accordance with embodiments of the present disclosure.
Figure 6B:
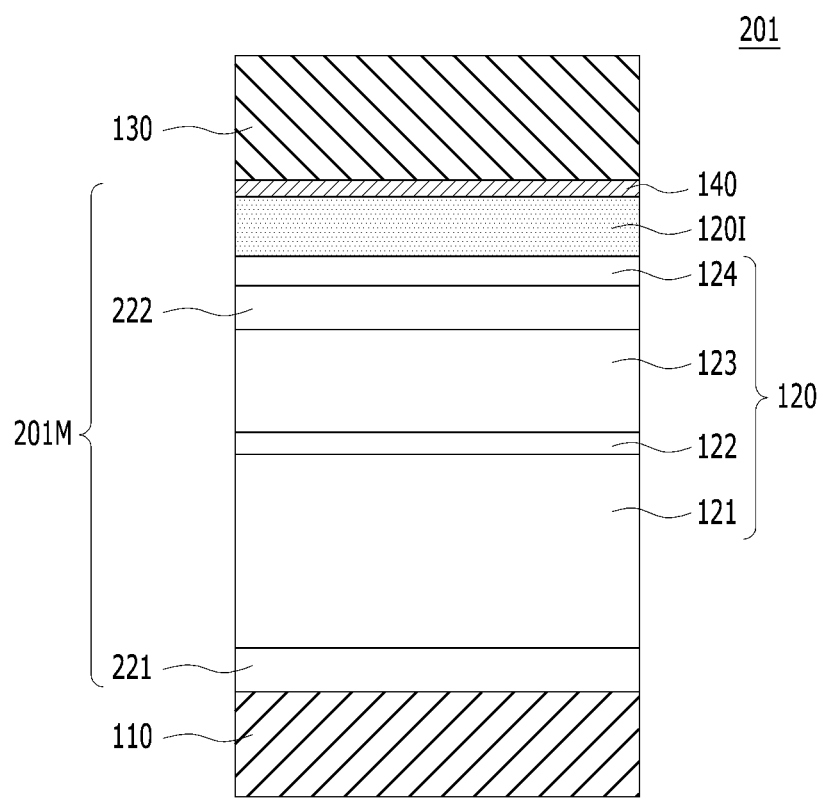

FIGS. 6A and 6B are cross-sectional views illustrating capacitors in accordance with embodiments of the present disclosure.

Referring to FIG. 6A, a capacitor 200 may be similar to the capacitor 100 of FIG. 1. The capacitor 200 may include a first conductive layer 110, a multi-layered stack 200M and a second conductive layer 130. The multi-layered stack 200M may include a dielectric layer stack 120, a dielectric interface layer 1201 and a high work function interface layer 140. The dielectric layer stack 120 may include a first dielectric layer 121, a first leakage blocking layer 122, a second dielectric layer 123 and a second leakage blocking layer 124. The first and second leakage blocking layers 122 and 124 may be embedded in the dielectric layer stack 120. The high work function interface layer 140 may be positioned between the dielectric interface layer 1201 and the second conductive layer 130.

The multi-layered stack 200M may further include an ultra high-k layer 220 between the dielectric layer stack 120 and the first conductive layer 110. The ultra high-k layer 220 may have a higher dielectric constant than the dielectric layer stack 120. The ultra high-k layer 220 may have a dielectric constant of approximately 60 or higher. The ultra high-k layer 220 and the dielectric layer stack 120 may include different materials. The ultra high-k layer 220 may have a tetragonal crystal structure.

The ultra high-k layer 220 may include a hafnium oxide-based material. The ultra high-k layer 220 may include tetragonal hafnium oxide. The tetragonal hafnium oxide refers to hafnium oxide having a tetragonal crystal structure. The bottom surface of the ultra high-k layer 220 may directly contact the first conductive layer 110, and the top surface of the ultra high-k layer 220 may directly contact the dielectric layer stack 120. The ultra high-k layer 220 may have a pure tetragonal crystal structure. The high dielectric constant of the ultra high-k layer 220 may be obtained by the dielectric layer stack 120. For example, the first dielectric layer 121 of the dielectric layer stack 120 may serve as a seed for promoting tetragonal crystallization of the ultra high-k layer 220.

The multi-layered stack 200M may include an H-Z-AZ-Z-AZ-T-ZN stack. In the H-Z-AZ-Z-AZ-T-Z stack, "H" may refer to tetragonal hafnium oxide.

Referring to FIG. 6B, a capacitor 201 may be similar to the capacitor 200 of FIG. 6A. The capacitor 201 may include a first conductive layer 110, a multi-layered stack 201M and a second conductive layer 130. The multi-layered stack 201M may include a dielectric layer stack 120, a dielectric interface layer 1201 and a high work function interface layer 140. The dielectric layer stack 120 may include a first dielectric layer 121, a first leakage blocking layer 122, a second dielectric layer 123 and a second leakage blocking layer 124. The first and second leakage blocking layers 122 and 124 may be embedded in the dielectric layer stack 120. The high work function interface layer 140 may be positioned between the dielectric interface layer 1201 and the second conductive layer 130.

The multi-layered stack 201M may further include a first ultra high-k layer 221 between the dielectric layer stack 120 and the first conductive layer 110. The first ultra high-k layer 221 may have a higher dielectric constant than the dielectric layer stack 120. The first ultra high-k layer 221 may have a dielectric constant of approximately 60 or higher. The first ultra high-k layer 221 and the dielectric layer stack 120 may include different materials. The first ultra high-k layer 221 may have a tetragonal crystal structure.

The first ultra high-k layer 221 may include a hafnium oxide-based material. The first ultra high-k layer 221 may include tetragonal hafnium oxide. The bottom surface of the first ultra high-k layer 221 may directly contact the first conductive layer 110, and the top surface of the first ultra high-k layer 221 may directly contact the first dielectric layer 121 of the dielectric layer stack 120. The first ultra high-k layer 221 may have a pure tetragonal crystal structure. The high dielectric constant of the first ultra high-k layer 221 may be obtained by the dielectric layer stack 120. For example, the first dielectric layer 121 of the dielectric layer stack 120 may serve as a seed for promoting tetragonal crystallization of the first ultra high-k layer 221.

The multi-layered stack 201M may further include a second ultra high-k layer 222. The second ultra high-k layer 222 may be embedded in the dielectric layer stack 120. The second ultra high-k layer 222 may have a higher dielectric constant than the dielectric layer stack 120. The second ultra high-k layer 222 may have a dielectric constant of approximately 60 or higher. The second ultra high-k layer 222 and the dielectric layer stack 120 may include different materials. The second ultra high-k layer 222 may have a tetragonal crystal structure.

The second ultra high-k layer 222 may include a hafnium oxide-based material. The second ultra high-k layer 222 may include tetragonal hafnium oxide. The top surface of the second ultra high-k layer 222 may directly contact the second leakage blocking layer 124, and the bottom surface of the second ultra high-k layer 222 may directly contact the second dielectric layer 123. The second ultra high-k layer 222 may have a tetragonal crystal structure. The high dielectric constant of the second ultra high-k layer 222 may be obtained by the dielectric layer stack 120. For example, the second dielectric layer 123 of the dielectric layer stack 120 may serve as a seed for promoting tetragonal crystallization of the second ultra high-k layer 222.

The multi-layered stack 201M may include an H-Z-AZ-Z-H-AZ-T-ZN stack.

In FIGS. 6A and 6B, each of the ultra high-k layer 220, the first ultra high-k layer 221 and the second ultra high-k layer 222 may further include a dopant. The dopant may include strontium (Sr), lanthanum (La), gadolinium (Gd), aluminum (Al), silicon (Si), yttrium (Y), zirconium (Zr), niobium (Nb), bismuth (Bi), germanium (Ge), dysprosium (Dy), titanium (Ti), cerium (Ce), magnesium (Mg) or nitrogen (N).

Figure 7A:
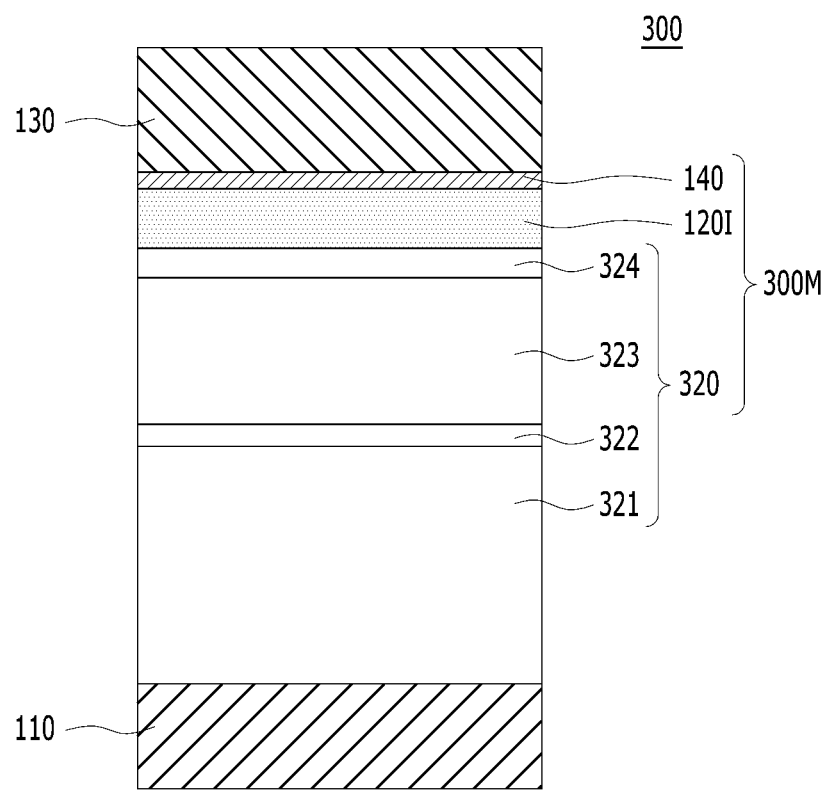
FIGS. 7A to 7C are cross-sectional views illustrating capacitors in accordance with embodiments of the present disclosure.
Figure 7B:
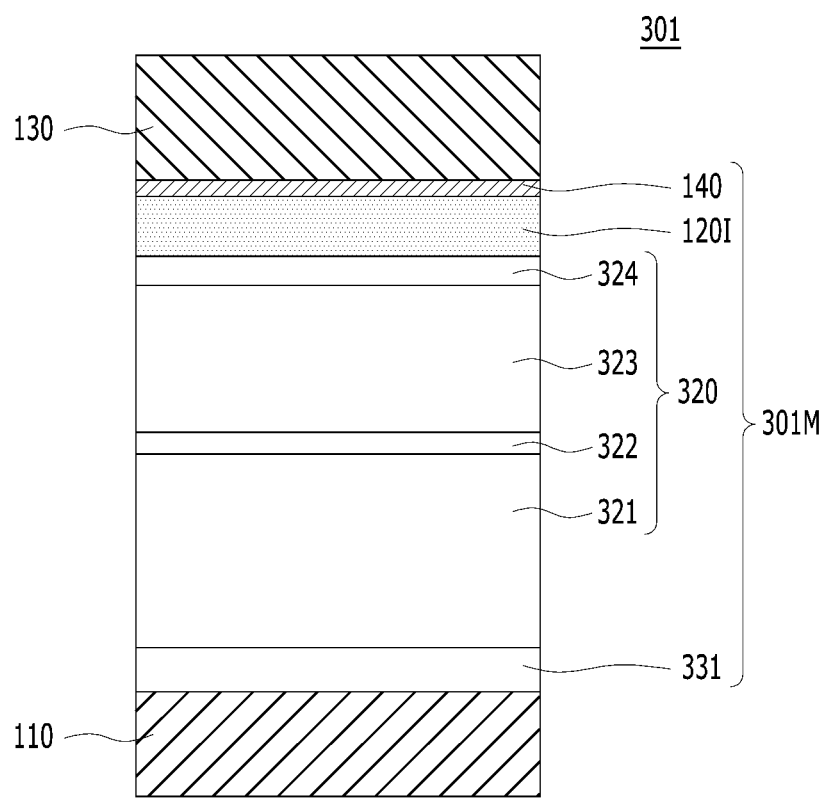
Figure 7C:
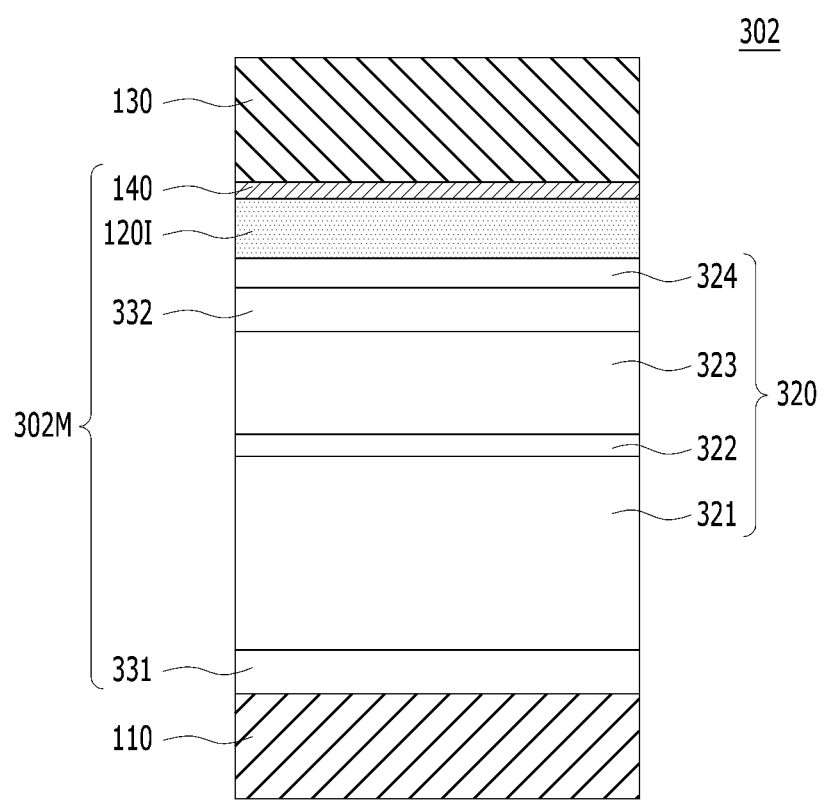

FIGS. 7A to 7C are cross-sectional views illustrating capacitors in accordance with embodiments of the present disclosure.

Referring to FIG. 7A, a capacitor 300 may be similar to the capacitor 100 of FIG. 1. The capacitor 300 may include a first conductive layer 110, a multi-layered stack 300M and a second conductive layer 130. The multi-layered stack 300M may include a dielectric layer stack 320, a dielectric interface layer 1201 and a high work function interface layer 140. The dielectric layer stack 320 may include first hafnium oxide 321, a first leakage blocking layer 322, second hafnium oxide 323 and a second leakage blocking layer 324. The dielectric interface layer 1201 may include titanium oxide. The high work function interface layer 140 may include zirconium nitride or carbon-doped zirconium nitride.

Each of the first hafnium oxide 321 and the second hafnium oxide 323 may include a hafnium oxide-based material. Therefore, the dielectric layer stack 320 may include the first hafnium oxide 321, the first leakage blocking layer 322, the second hafnium oxide 323 and the second leakage blocking layer 324. Each of the first and second leakage blocking layers 322 and 324 may include aluminum. The first and second leakage blocking layers 322 and 324 may be embedded in the hafnium oxide-based material. Each of the first and second leakage blocking layers 322 and 324 may include aluminum-doped hafnium oxide. Each of the first hafnium oxide 321 and the second hafnium oxide 323 may have a tetragonal crystal structure.

The multi-layered stack 300M may include a H-AH-H-AH-T-ZN stack. In the H-AH-H-AH-T-Z stack, "AH" may refer to aluminum-doped hafnium oxide.

Referring to FIG. 7B, a capacitor 301 may be similar to the capacitor 300 of FIG. 7A. The capacitor 301 may include a first conductive layer 110, a multi-layered stack 301M and a second conductive layer 130. The multi-layered stack 301M may include a dielectric layer stack 320, a dielectric interface layer 1201 and a high work function interface layer 140. The dielectric layer stack 320 may include first hafnium oxide 321, a first leakage blocking layer 322, second hafnium oxide 323 and a second leakage blocking layer 324.

Each of the first hafnium oxide 321 and the second hafnium oxide 323 may include a hafnium oxide-based material. Therefore, the dielectric layer stack 320 may include the first hafnium oxide 321, the first leakage blocking layer 322, the second hafnium oxide 323 and the second leakage blocking layer 324. Each of the first and second leakage blocking layers 322 and 324 may include aluminum. The first and second leakage blocking layers 322 and 324 may be embedded in the hafnium oxide-based material. Each of the first and second leakage blocking layers 322 and 324 may include aluminum-doped hafnium oxide. Each of the first hafnium oxide 321 and the second hafnium oxide 323 may have a tetragonal crystal structure.

The multi-layered stack 301M may further include a seed layer 331 between the dielectric layer stack 320 and the first conductive layer 110. The seed layer 331 may have a lower dielectric constant than the dielectric layer stack 320. The seed layer 331 may have a dielectric constant of approximately 40. The seed layer 331 and the dielectric layer stack 320 may include different materials. The seed layer 331 may have a tetragonal crystal structure.

The seed layer 331 may include a zirconium oxide-based material. The seed layer 331 may include tetragonal zirconium oxide. The bottom surface of the seed layer 331 may directly contact the first conductive layer 110, and the top surface of the seed layer 331 may directly contact the dielectric layer stack 320. The seed layer 331 may have a pure tetragonal crystal structure. For example, the seed layer 331 may serve as a seed for promoting tetragonal crystallization of the dielectric layer stack 320. The seed layer 331 may serve as a seed for promoting tetragonal crystallization of the first hafnium oxide 321.

The multi-layered stack 301M may include a Z-H-AH-H-AH-T-ZN stack.

Referring to FIG. 7C, a capacitor 302 may be similar to the capacitor 301 of FIG. 7B. The capacitor 302 may include a first conductive layer 110, a multi-layered stack 302M and a second conductive layer 130. The multi-layered stack 302M may include a dielectric layer stack 320, a dielectric interface layer 1201 and a high work function interface layer 140. The dielectric layer stack 320 may include first hafnium oxide 321, a first leakage blocking layer 322, second hafnium oxide 323 and a second leakage blocking layer 324. Each of the first and second leakage blocking layers 322 and 324 may include aluminum. The first and second leakage blocking layers 322 and 324 may be embedded in a hafnium oxide-based material. Each of the first hafnium oxide 321 and the second hafnium oxide 323 may have a tetragonal crystal structure. The multi-layered stack 302M may further include a first seed layer 331 between the dielectric layer stack 320 and the first conductive layer 110. The first seed layer 331 may have a lower dielectric constant than the dielectric layer stack 320. The first seed layer 331 may have a dielectric constant of approximately 40.

The first seed layer 331 and the dielectric layer stack 320 may include different materials. The first seed layer 331 may have a tetragonal crystal structure.

The first seed layer 331 may include a zirconium oxide-based material. The first seed layer 331 may include tetragonal zirconium oxide. The bottom surface of the first seed layer 331 may directly contact the first conductive layer 110, and the top surface of the first seed layer 331 may directly contact the dielectric layer stack 320. The first seed layer 331 may have a pure tetragonal crystal structure. The first seed layer 331 may serve as a seed for promoting tetragonal crystallization of the dielectric layer stack 320. The first seed layer 331 may serve as a seed for promoting tetragonal crystallization of the first hafnium oxide 321.

The multi-layered stack 302M may further include a second seed layer 332 embedded in the dielectric layer stack 320. The second seed layer 332 may have a lower dielectric constant than the dielectric layer stack 320. The second seed layer 332 may have a dielectric constant of approximately 40. The second seed layer 332 may contact the second hafnium oxide 323.

The second seed layer 332 and the dielectric layer stack 320 may include different materials. The second seed layer 332 may have a tetragonal crystal structure. The first and second seed layers 331 and 332 may include the same material.

The second seed layer 332 may include a zirconium oxide-based material. The second seed layer 332 may include tetragonal zirconium oxide. The bottom surface of the second seed layer 332 may directly contact the second hafnium oxide 323, and the top surface of the second seed layer 332 may directly contact the second leakage blocking layer 324. The second seed layer 332 may have a pure tetragonal crystal structure. For example, the second seed layer 332 may serve as a seed for promoting tetragonal crystallization of the second hafnium oxide 323.

As described above, the first and second seed layers 331 and 332 may serve as seeds for promoting the tetragonal crystallization of the first and second hafnium oxide 321 and 323, respectively.

The multi-layered stack 302M may include a Z-H-AH-H-Z-AH-T-ZN stack.

Figure 8:
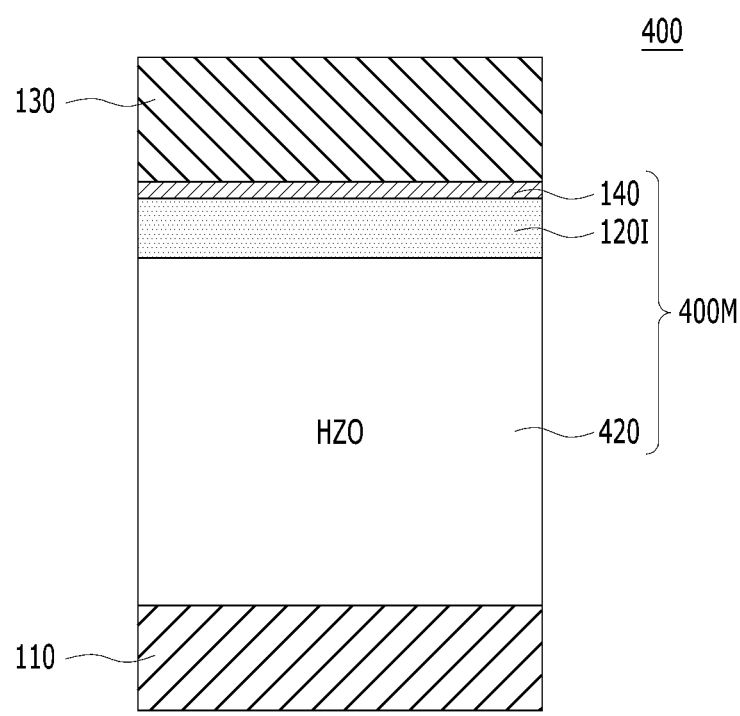
FIG. 8 is a cross-sectional view illustrating a capacitor in accordance with an embodiment of the present disclosure.

FIG. 8 is a cross-sectional view illustrating a capacitor 400 in accordance with an embodiment of the present disclosure.

Referring to FIG. 8, the capacitor 400 may be similar to the capacitor 100 of FIG. 1. The capacitor 400 may include a first conductive layer 110, a multi-layered stack 400M and a second conductive layer 130. The multi-layered stack 400M may include a dielectric layer 420, a dielectric interface layer 1201 and a high work function interface layer 140. The dielectric layer 420 may include an HZO(HfZrO) structure in which hafnium oxide and zirconium oxide are intermixed.

Figure 9A:
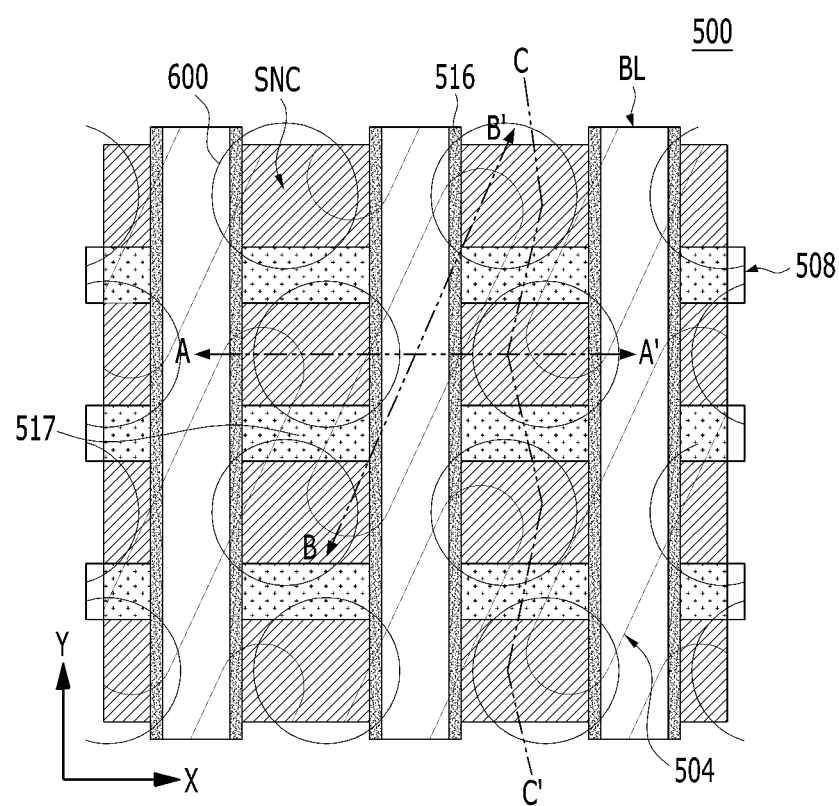
FIGS. 9A to 9C are diagrams illustrating a memory cell.
Figure 9B:
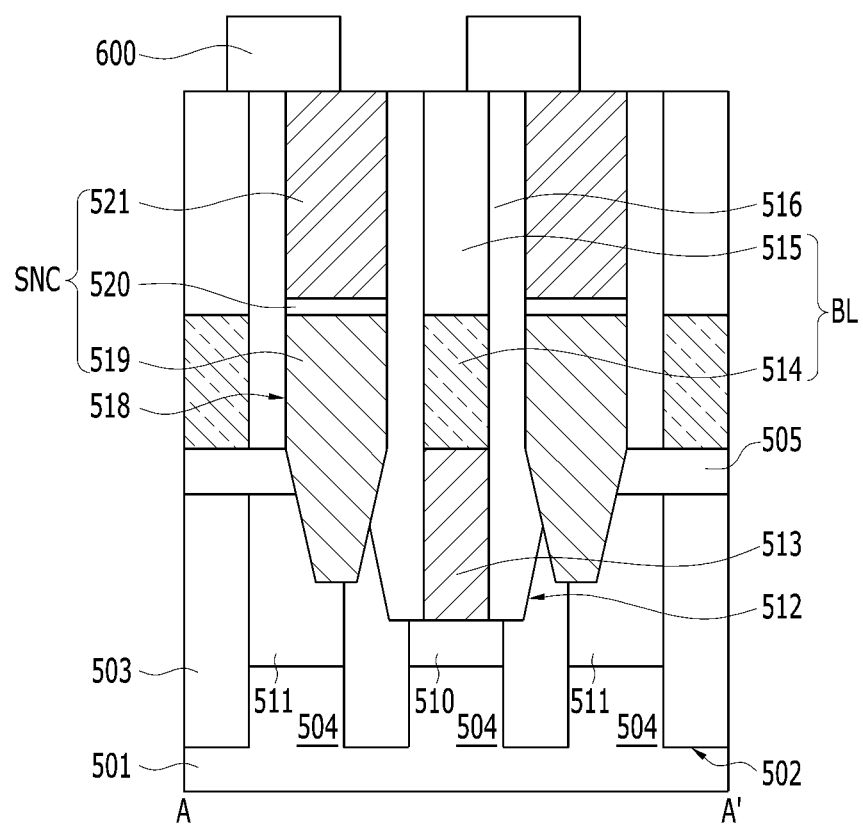
Figure 9C:
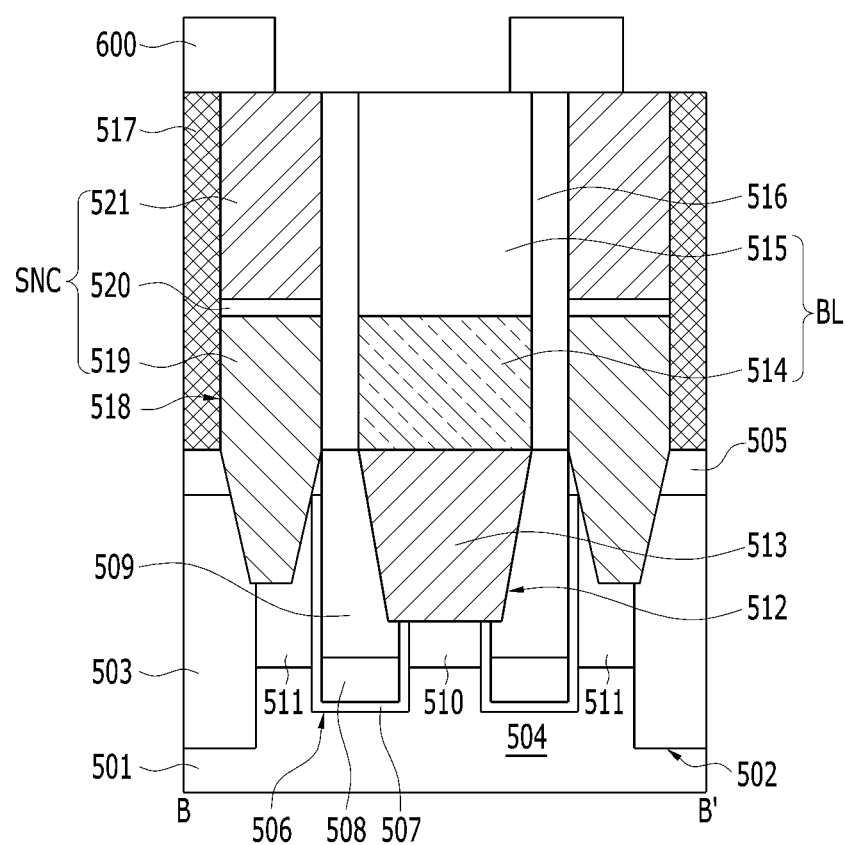

FIGS. 9A to 9C are diagrams illustrating a memory cell 500. FIG. 9B is a cross-sectional view taken along an A-A' line of FIG. 9A. FIG. 9C is a cross-sectional view taken along a B-B' line of FIG. 9A.

The memory cell 500 may include a cell transistor including a buried word line 508, a bit line 514, and a capacitor 600. The capacitor 600 may include a dielectric layer stack, and the dielectric layer stack may include any one of the dielectric layer stacks described in the above embodiments.

The memory cell 500 is described below in detail.

An isolation layer 503 and an active region 504 may be formed in a substrate 501. A plurality of active regions 504 may be defined by the isolation layer 503. The substrate 501 may be a material that is suitable for semiconductor processing. The substrate 501 may include a semiconductor substrate. The substrate 501 may be formed of a silicon-containing material. The substrate 501 may include silicon, monocrystalline silicon, polysilicon, amorphous silicon, silicon germanium, monocrystalline silicon germanium, polycrystalline silicon germanium, carbon-doped silicon, combinations thereof or multi-layers thereof. The substrate 501 may include another semiconductor material, such as germanium. The substrate 501 may include an III/V-group semiconductor substrate, for example, a chemical compound semiconductor substrate such as a gallium arsenide (GaAs). The substrate 501 may include a Silicon-On-Insulator (SOI) substrate. The isolation layer 503 may be formed in an isolation trench 502 through a Shallow Trench Isolation (STI) process.

A word line trench 506 may be formed in the substrate 501. The word line trench 506 may also be referred to as a gate trench. A gate dielectric layer 507 may be formed on the surface of the word line trench 506. The buried word line 508 which fills a portion of the word line trench 506 may be formed on the gate dielectric layer 507. The buried word line 508 may also be referred to as a buried gate electrode. A word line capping layer 509 may be formed on the buried word line 508. The top surface of the buried word line 508 may be lower than the top surface of the substrate 501. The buried word line 508 may be a low-resistivity metal material. The buried word line 508 may be formed by sequentially stacking titanium nitride and tungsten. In some embodiments, the buried word line 508 may be formed of titanium nitride (TiN) only.

A first impurity region 510 and a second impurity region 511 may be formed in the substrate 501. The first and second impurity regions 510 and 511 may be spaced apart from each other by the word line trench 506. The first and second impurity regions 510 and 511 may also be referred to as first and second source/drain regions, respectively. The first and second impurity regions 510 and 511 may include an N-type impurity such as arsenic (As) and phosphorus (P). Consequently, the buried word line 508 and the first and second impurity regions 510 and 511 may become a cell transistor. The cell transistor may improve a short-channel effect due to the presence of the buried word line 508.

A bit line contact plug 513 may be formed on the substrate 501. The bit line contact plug 513 may be coupled to the first impurity region 510. The bit line contact plug 513 may be positioned inside a bit line contact hole 512. The bit line contact hole 512 may be formed in a hard mask layer 505. The hard mask layer 505 may be formed on the substrate 501. The bit line contact hole 512 may expose the first impurity region 510. The bottom surface of the bit line contact plug 513 may be lower than the top surface of the substrate 501. The bit line contact plug 513 may be formed of polysilicon or a metal material. A portion of the bit line contact plug 513 may have a smaller line width than the diameter of the bit line contact hole 512. The bit line 514 may be formed on the bit line contact plug 513. A bit line hard mask 515 may be formed on the bit line 514. The stacked structure of the bit line 514 and the bit line hard mask 515 may also be referred to as a bit line structure BL. The bit line 514 may have a linear shape that is extended in a direction crossing the buried word line 508. A portion of the bit line 514 may be coupled to the bit line contact plug 513. The bit line 514 may include a metal material. The bit line hard mask 515 may include a dielectric material.

A bit line spacer 516 may be formed on the sidewall of the bit line structure BL. The bottom portion of the bit line spacer 516 may be extended to be formed on both sidewalls of the bit line contact plug 513. The bit line spacer 516 may include silicon oxide, silicon nitride or a combination thereof. In some embodiments, the bit line spacer 516 may include an air gap. For example, the bit line spacer 516 may have a nitride-air gap-nitride (NAN) structure in which the air gap is located between silicon nitrides.

A storage node contact plug SNC may be formed between the neighboring bit line structures BL. The storage node contact plug SNC may be formed in a storage node contact hole 518. The storage node contact plug SNC may be coupled to the second impurity region 511. The storage node contact plug SNC may include a bottom plug 519 and a top plug 521. The storage node contact plug SNC may further include an ohmic contact layer 520 between the bottom plug 519 and the top plug 521. The ohmic contact layer 520 may include metal silicide. The top plug 521 may include a metal material, and the bottom plug 519 may include a silicon-containing material.

From a perspective view in parallel with the bit line structure BL, a plug isolation layer 517 may be formed between the neighboring storage node contact plugs SNC. The plug isolation layer 517 may be formed between the neighboring bit line structures BL, and may provide the storage node contact hole 518 along with the hard mask layer 505.

The capacitor 600 may be formed on the storage node contact plug SNC.

FIGS. 10A to 10F are cross-sectional views illustrating application examples of the capacitor 600 illustrated in FIGS. 9A to 9C.

Figure 10A:
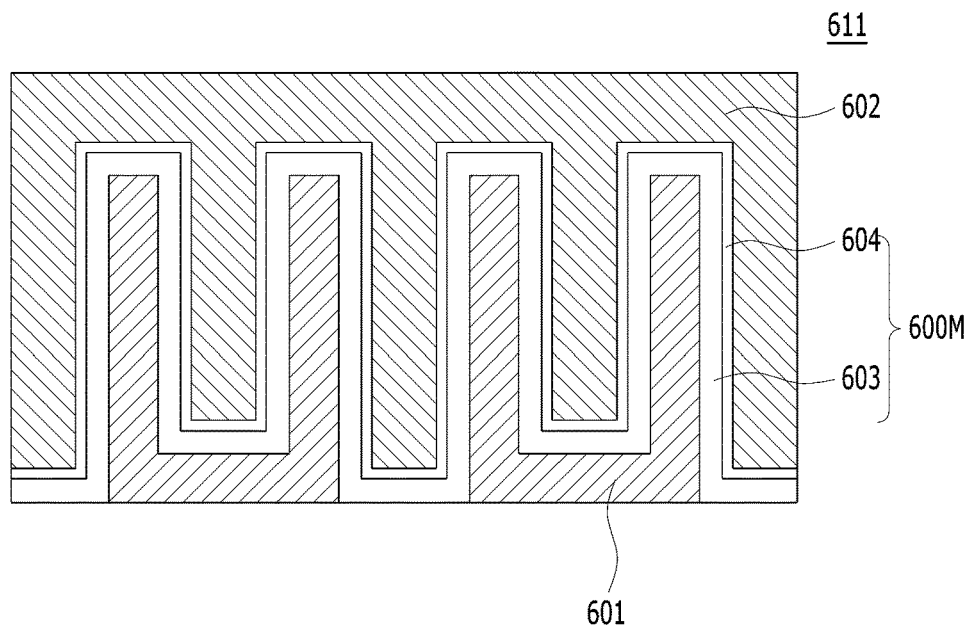
FIGS. 10A to 10F are cross-sectional views illustrating application examples of a capacitor of the memory cell.

Referring to FIG. 10A, a capacitor 611 may include a bottom electrode 601, a multi-layered stack 600M and a top electrode 602. The first conductive layer 110 and the second conductive layer 130 of the above-described embodiments may correspond to the bottom electrode 601, and the top electrode 602, respectively. The bottom electrode 601 may be formed in a cylinder shape. The multi-layered stack 600M may be formed between the bottom electrode 601 and the top electrode 602. The multi-layered stack 600M may include a dielectric layer stack 603 and a high work function interface layer 604. The dielectric layer stack 603 may correspond to any one of the dielectric layer stacks of the above-described embodiments. For example, the dielectric layer stack 603 may include a zirconium oxide-based material or a hafnium oxide-based material, and the high work function interface layer 604 may include zirconium nitride or carbon-doped zirconium nitride. Although not illustrated, a dielectric interface layer may be further formed between the dielectric layer stack 603 and the high work function interface layer 604.

Hereinafter, detailed descriptions of components and structures of capacitors 612, 613, 614, 615 and 616 illustrated in FIGS. 10B to 10F that are the same as or similar to those of the capacitor 611 illustrated in FIG. 10A are omitted.

Figure 10B:
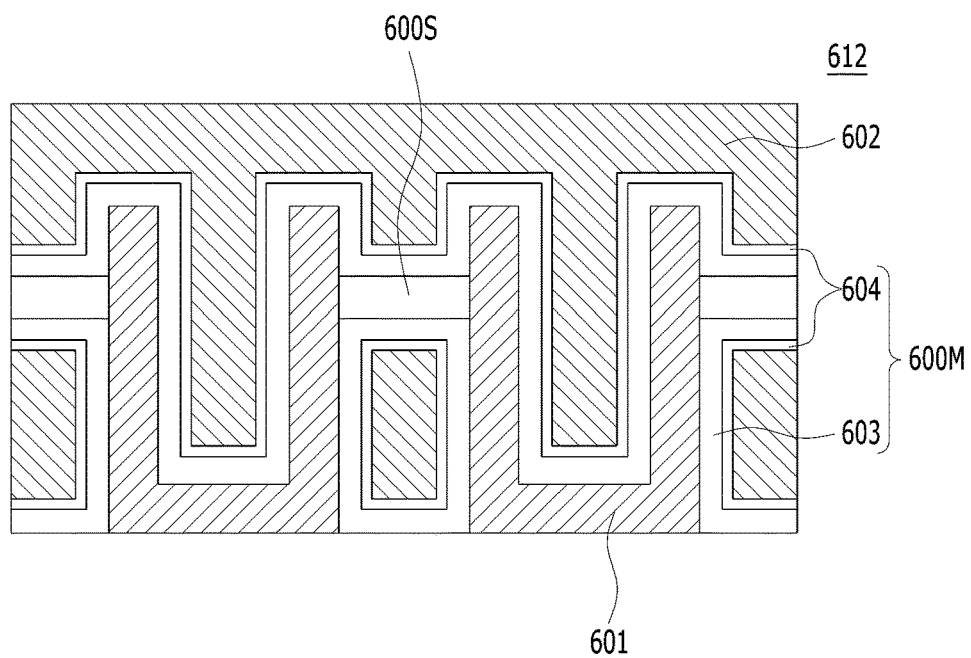

Referring to FIG. 10B, the capacitor 612 may include a cylinder-shaped bottom electrode 601, a multi-layered stack 600M and a top electrode 602. The capacitor 612 may further include a supporter 600S. The supporter 600S is a structure for supporting an outer wall of the bottom electrode 601. The supporter 600S may include silicon nitride. The supporter 600S may have a single supporter structure. In some embodiments, a plurality of supporters 600S may support the outer wall of the bottom electrode 601. The plurality of supporters 600S may be formed in a multi-layered level supporter structure. The multi-layered level supporter structure may include two or more supporters. For example, a three-layer level supporter structure may include a bottom supporter for supporting the bottom outer wall of the bottom electrode 601, an intermediate supporter for supporting the intermediate outer wall of the bottom electrode 601 and a top supporter for supporting the top outer wall of the bottom electrode 601.

The multi-layered stack 600M may include a dielectric layer stack 603 and a high work function interface layer 604. The dielectric layer stack 603 may correspond to any one of the dielectric layer stacks of the above-described embodiments. For example, the dielectric layer stack 603 may include a zirconium oxide-based material or a hafnium oxide-based material, and the high work function interface layer 604 may include zirconium nitride or carbon-doped zirconium nitride. Although not illustrated, a dielectric interface layer may be further formed between the dielectric layer stack 603 and the high work function interface layer 604.

Figure 10C:
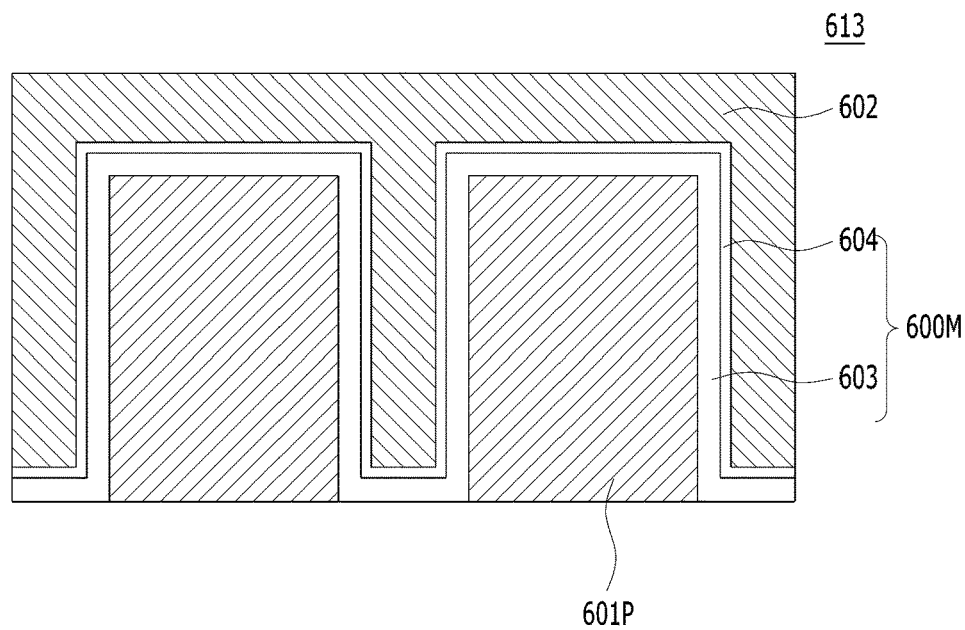
Figure 10D:
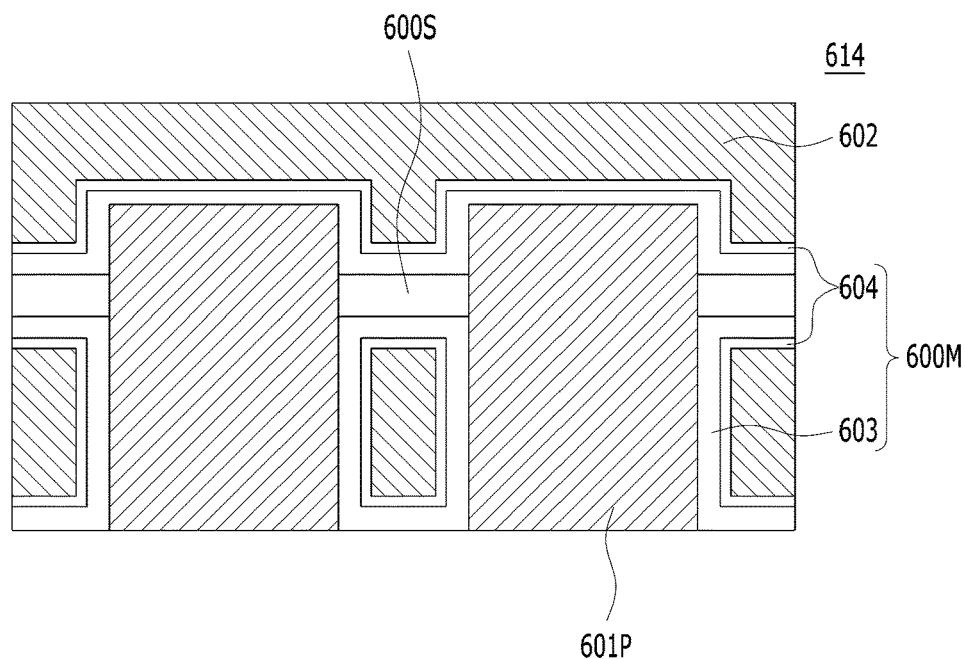

Referring to FIGS. 10C and 10D, each of the capacitors 613 and 614 may include a pillar-shaped bottom electrode 601P, a multi-layered stack 600M and a top electrode 602. The capacitor 614 illustrated in FIG. 10D may further include a supporter 600S. The multi-layered stack 600M may include a dielectric layer stack 603 and a high work function interface layer 604. The dielectric layer stack 603 may correspond to any one of the dielectric layer stacks of the above-described embodiments. For example, the dielectric layer stack 603 may include a zirconium oxide-based material or a hafnium oxide-based material, and the high work function interface layer 604 may include zirconium nitride or carbon-doped zirconium nitride. Although not illustrated, a dielectric interface layer may be further formed between the dielectric layer stack 603 and the high work function interface layer 604.

Figure 10E:
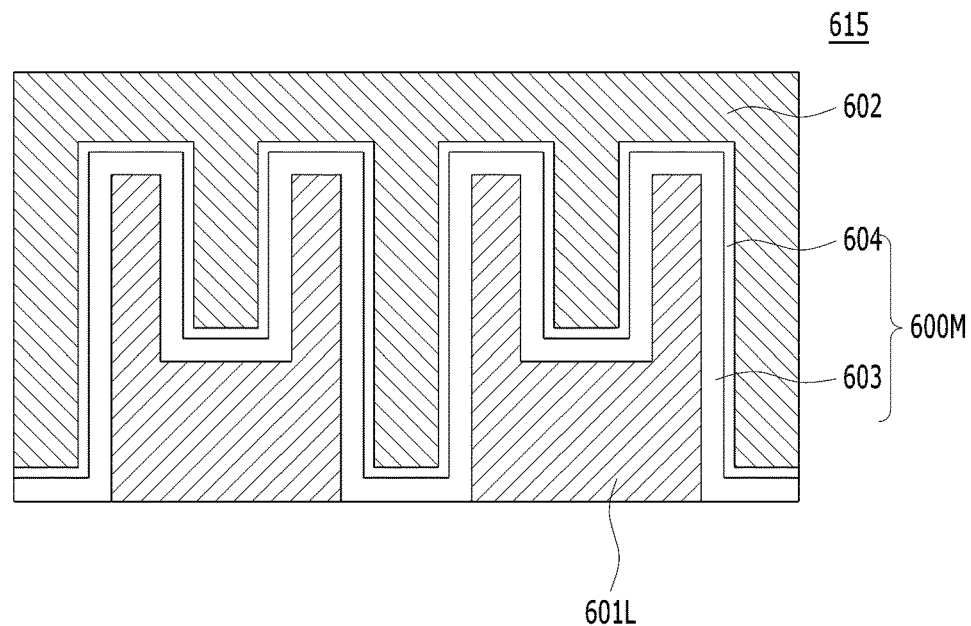
Figure 10F:
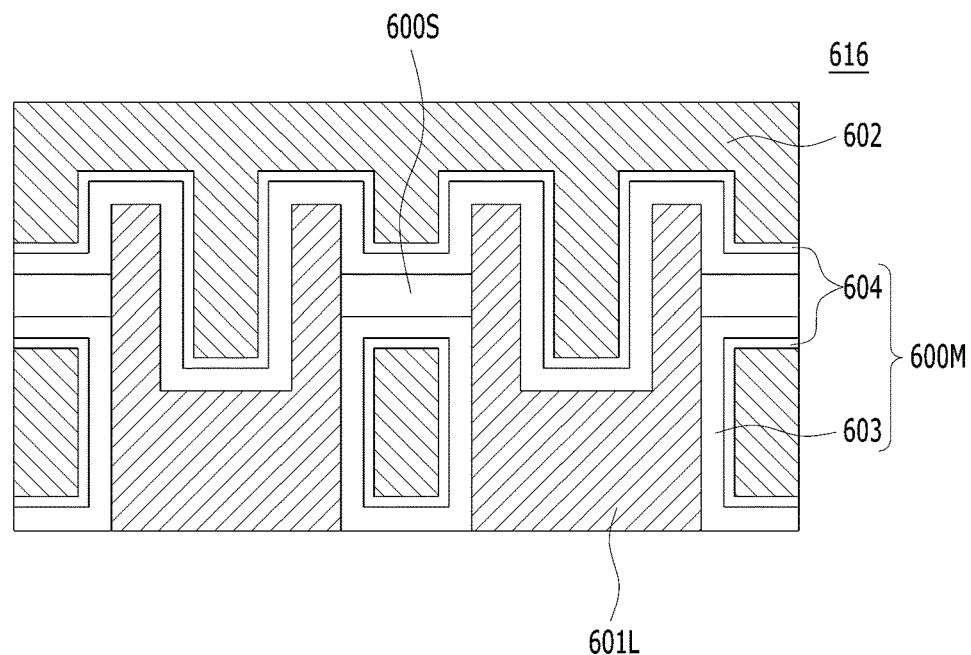

Referring to FIGS. 10E and 10F, each of the capacitors 615 and 616 may include a pylinder-shaped bottom electrode 601L, a multi-layered stack 600M and a top electrode 602. The capacitor 616 shown in FIG. 10F may further include a supporter 600S. The bottom electrode 601L may have a hybrid structure in which a pillar shape and a cylinder shape are merged. A pylinder-shaped bottom electrode 601L refers to the hybrid structure of the pillar shape and the cylinder shape of the bottom electrode 601L. The multi-layered stack 600M may include a dielectric layer stack 603 and a high work function interface layer 604. The dielectric layer stack 603 may correspond to any one of the dielectric layer stacks of the above-described embodiments. For example, the dielectric layer stack 603 may include a zirconium oxide-based material or a hafnium oxide-based material, and the high work function interface layer 604 may include zirconium nitride or carbon-doped zirconium nitride. Although not illustrated, a dielectric interface layer may be further formed between the dielectric layer stack 603 and the high work function interface layer 604.

According to FIGS. 10A to 10F, the capacitors 611 to 616 may include the bottom electrodes 601, 601P and 601L, the top electrode 602, the dielectric layer stack 603 between the bottom electrodes 601, 601P and 601L and the top electrode 602, and the high work function interface layer 604 between the dielectric layer stack 603 and the top electrode 602. The dielectric layer stack 603 may have a tetragonal crystal structure. The dielectric layer stack 603 may include a zirconium oxide-based material or a hafnium oxide-based material. The dielectric layer stack 603 may include zirconium oxide having a tetragonal crystal structure, hafnium oxide having a tetragonal crystal structure or a combination thereof. The dielectric layer stack 603 may include any one of a Z-AZ-Z($ZrO_2$—Al doped $ZrO_2$—$ZrO_2$) stack, a Z-AZ-Z-AZ($ZrO_2$—Al doped $ZrO_2$—$ZrO_2$—Al doped $ZrO_2$) stack, an H-Z-AZ-Z-H-AZ($HfO_2$—$ZrO_2$—Al doped $ZrO_2$—$ZrO_2$—$HfO_2$—Al doped $ZrO_2$) stack, an H-AH-H ($HfO_2$—Al doped $HfO_2$—$HfO_2$) stack and a Z-H-AH-H-Z ($ZrO_2$—$HfO_2$—Al doped $HfO_2$—$HfO_2$—$ZrO_2$) stack. The high work function interface layer 604 may include a zirconium nitride-based material. The dielectric interface layer, not illustrated, may be formed between the dielectric layer stack 603 and the high work function interface layer 604. The dielectric interface layer may include titanium oxide.

As described above, the dielectric layer stack 603 and the high work function interface layer 604 may be formed, which makes it possible to obtain a capacitor having a high dielectric constant and low leakage current. Accordingly, it is possible to fabricate a high-integrated dynamic random-access memory (DRAM) whose refresh characteristics and reliability are improved.

According to the embodiments, a multi-layered stack may be applied to peripheral circuits of the DRAM. For example, the DRAM may include a memory cell region including a memory cell (reference numeral "500" of FIG. 9A) and a peripheral circuit region including a peripheral transistor, and at least one of the peripheral transistor and the capacitor 600 of the memory cell 500 may include any one of the multi-layered stacks in the above-described embodiments. For example, the multi-layered stack may include a dielectric layer stack, a dielectric interface layer and a high work function interface layer, wherein the high work function interface layer may include zirconium nitride or carbon-doped zirconium nitride.

According to the embodiments, the dielectric layer stack may be applied to a Metal-Insulator-Metal (MIM) capacitor. For example, the MIM capacitor may include a multi-layered stack including a first metal electrode, a second metal electrode and a high work function interface layer formed between the first metal electrode and the second metal electrode, wherein the high work function interface layer may include zirconium nitride or carbon-doped zirconium nitride.

According to the embodiments, the dielectric layer stack may be applied to an embedded DRAM. For example, the embedded DRAM may include a logic circuit and a capacitor, and the capacitor of the embedded DRAM may include a multi-layered stack including a high work function interface layer, wherein the high work function interface layer may include zirconium nitride or carbon-doped zirconium nitride.

According to the embodiments, the dielectric layer stack may be applied to a three-dimensional (3D) NAND. For example, the 3D NAND may include a pillar-shaped channel layer, a word line surrounding the pillar-shaped channel layer and a multi-layered stack between the pillar-shaped channel layer and the word line, wherein the multi-layered stack may include a dielectric layer stack and a high work function interface layer.

According to the embodiments, a high work function interface layer may be formed using a zirconium nitride-based material, thereby reducing leakage current of a capacitor.

While the present invention has been described with respect to specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A method for fabricating a capacitor, comprising:
   forming a first conductive layer;
   forming a dielectric layer stack in which a leakage blocking material is embedded, on the first conductive layer;
   forming a dielectric interface layer on the dielectric layer stack;
   forming a high work function interface layer on the dielectric interface layer; and
   forming a second conductive layer on the high work function interface layer,
   wherein the dielectric interface layer comprises a material having a higher electronegativity than the dielectric layer stack.

2. The method of claim 1, wherein the high work function interface layer comprises a material having a higher work function than the dielectric layer stack.

3. The method of claim 1, wherein the high work function interface layer is formed of a zirconium nitride-based material.

4. The method of claim 1, wherein the high work function interface layer comprises zirconium nitride or carbon-doped zirconium nitride.

5. The method of claim 1, wherein the forming of the high work function interface layer is performed by atomic layer deposition (ALD) of zirconium nitride.

6. The method of claim 1, wherein the forming of the high work function interface layer is performed by repeating a unit cycle consisting of zirconium source material injection, purge, reaction gas injection and purge.

7. The method of claim 6, wherein the zirconium source material comprises a carbon-containing zirconium source material.

8. The method of claim 6, wherein the reaction gas comprises $NH_3$.

9. The method of claim 1, wherein the forming of the dielectric layer stack, the dielectric interface layer and the high work function interface layer is performed by atomic layer deposition (ALD).

10. The method of claim 1, wherein the dielectric layer stack comprises any one of a Z-AZ—Z($ZrO_2$—Al doped $ZrO_2$—$ZrO_2$) stack, a Z-AZ—Z-AZ($ZrO_2$—Al doped $ZrO_2$—$ZrO_2$—Al doped $ZrO_2$) stack, an H—Z-AZ—Z—H-AZ($HfO_2$—$ZrO_2$—Al doped $ZrO_2$—$ZrO_2$—$HfO_2$—Al doped $ZrO_2$) stack, an H-AH—H($HfO_2$—Al doped $HfO_2$—$HfO_2$) stack and a Z—H-AH—H—Z($ZrO_2$—$HfO_2$—Al doped $HfO_2$—$HfO_2$—$ZrO_2$) stack.

* * * * *